United States Patent
Umezaki

(10) Patent No.: US 10,068,927 B2
(45) Date of Patent: Sep. 4, 2018

(54) SEMICONDUCTOR DEVICE, DISPLAY MODULE, AND ELECTRONIC DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 127 days.

(21) Appl. No.: 14/886,335

(22) Filed: Oct. 19, 2015

(65) Prior Publication Data
US 2016/0115015 A1 Apr. 28, 2016

(30) Foreign Application Priority Data
Oct. 23, 2014 (JP) ................. 2014-215922

(51) Int. Cl.
| | |
|---|---|
| H03B 5/36 | (2006.01) |
| G09G 3/34 | (2006.01) |
| G09G 3/32 | (2016.01) |
| G09G 3/20 | (2006.01) |
| B81B 3/00 | (2006.01) |

(Continued)

(52) U.S. Cl.
CPC ........ H01L 27/124 (2013.01); H01L 27/1225 (2013.01)

(58) Field of Classification Search
CPC ........ G06T 1/20; G09G 3/3433; H03B 5/364; B81B 3/0083; G02B 25/023–25/0841
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.

(Continued)

*Primary Examiner* — Lin Li
(74) *Attorney, Agent, or Firm* — Fish & Richardson P.C.

(57) ABSTRACT

A semiconductor device includes a MEMS device, a first transistor that supplies a first voltage to a first electrode of the MEMS device, a second transistor that supplies a second voltage to the first electrode of the MEMS device, a third transistor that supplies a first video signal to a gate of the first transistor, a fourth transistor that supplies the first voltage to a second electrode of the MEMS device, a fifth transistor that supplies the second voltage to the second electrode of the MEMS device, and a sixth transistor that supplies a second video signal to a gate of the fourth transistor. A gate of the second transistor is connected to the gate of the fourth transistor. A gate of the fifth transistor is connected to the gate of the first transistor.

12 Claims, 33 Drawing Sheets

(51) Int. Cl.
  *G02B 26/02* (2006.01)
  *G02B 26/00* (2006.01)
  *H01L 27/12* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,730,186 B2 | 5/2014 | Tamura et al. |
| 8,766,608 B2 | 7/2014 | Yamazaki et al. |
| 8,891,051 B2 | 11/2014 | Yamazaki et al. |
| 8,902,205 B2 | 12/2014 | Miyazawa et al. |
| 8,975,695 B2 * | 3/2015 | Yamazaki ............ B81B 3/0083 257/342 |
| 8,994,704 B2 | 3/2015 | Miyazawa et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0007296 A1 * | 1/2008 | Umezaki .................. G09G 3/20 326/62 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0174532 A1 * | 7/2008 | Lewis .................. G09G 3/3433 345/85 |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0220117 A1 | 9/2010 | Kimura |
| 2012/0262243 A1 * | 10/2012 | Yajima .................. H03B 5/364 331/156 |
| 2012/0293852 A1 * | 11/2012 | Cho .................... G02B 26/023 359/230 |
| 2012/0306562 A1 * | 12/2012 | Miyamoto ......... G02B 26/0841 327/434 |
| 2013/0063041 A1 * | 3/2013 | Kimura ................ G09G 3/3233 315/291 |
| 2013/0076713 A1 * | 3/2013 | Kim ........................ G09G 3/34 345/208 |
| 2014/0085017 A1 | 3/2014 | Tsinker |
| 2014/0231770 A1 | 8/2014 | Inoue et al. |
| 2015/0325180 A1 * | 11/2015 | Silva .................. G09G 3/3433 345/690 |
| 2016/0090291 A1 | 3/2016 | Umezaki |
| 2016/0096725 A1 | 4/2016 | Umezaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-239046 A | 12/2012 |
| JP | 2014-142405 A | 8/2014 |

(56) References Cited

FOREIGN PATENT DOCUMENTS

| JP | 2014-522509 A | 9/2014 |
|---|---|---|
| JP | 2014-523659 A | 9/2014 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17. 22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide Tfts and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. Amoled Display With Driver Circuit Using Amorphous In—Ga—Zn-Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back—Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3. ENG.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) ,Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) ,2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B. (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZNO Thin-Film Transistors Produced at Room Temperature", Appl. Phys. Lett. (Applied Physics Letters) ,Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) ,Sep. 13, 2004, vol. 85, No. 11, pp. 1993-1995.

* cited by examiner

SEMICONDUCTOR DEVICE, DISPLAY MODULE, AND ELECTRONIC DEVICE

BACKGROUND OF THE INVENTION

1. Field of the Invention

One embodiment of the present invention relates to a semiconductor device, a display module, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

Display devices including display elements using microelectromechanical systems (MEMS) have been developed. Patent Documents 1 to 4 each disclose a pixel circuit including a display element using MEMS.

REFERENCE

Patent Document 1: Japanese Published Patent Application No. 2012-239046

Patent Document 2: Japanese Published Patent Application No. 2014-142405

Patent Document 3: Japanese Translation of PCT International Application No. 2014-522509

Patent Document 4: Japanese Translation of PCT International Application No. 2014-523659

SUMMARY OF THE INVENTION

Patent Documents 1 to 3 have a problem in that it is difficult to continuously supply voltage to the display element using the MEMS. Patent Document 4 has a problem of requiring a CMOS circuit.

An object of one embodiment of the present invention is to provide a pixel, a semiconductor device, or a display device having a novel structure. An object of one embodiment of the present invention is to decrease a signal amplitude voltage or to provide a structure for achieving it. An object of one embodiment of the present invention is to continuously apply voltage to a display element or to provide a structure for achieving it. An object of one embodiment of the present invention is to precisely control the gray level of a display element or to provide a structure for achieving it. An object of one embodiment of the present invention is to prevent current from being generated all the time or to provide a structure for achieving it. An object of one embodiment of the present invention is to reduce power consumption or to provide a structure for achieving it. An object of one embodiment of the present invention is to use only transistors of the same polarity or to provide a structure for achieving it. An object of one embodiment of the present invention is to reduce the number of fabrication steps or to provide a structure for achieving it. An object of one embodiment of the present invention is to shorten the time during which a shoot-through current occurs or to provide a structure for achieving it. An object of one embodiment of the present invention is to reduce a shoot-through current or to provide a structure for achieving it. An object of one embodiment of the present invention is to reduce the layout area or to provide a structure for achieving it.

One embodiment of the present invention does not necessarily achieve all the objects listed above and only needs to achieve at least one of the objects. The description of the above objects does not preclude the existence of other objects. Other objects are apparent from and can be derived from the description of the specification, the drawings, the claims, and the like.

One embodiment of the present invention is a semiconductor device including first to sixth transistors and a MEMS device. One of a source and a drain of the first transistor is electrically connected to one of a source and a drain of the second transistor. One of a source and a drain of the third transistor is electrically connected to a gate of the first transistor. One of a source and a drain of the fourth transistor is electrically connected to one of a source and a drain of the fifth transistor. One of a source and a drain of the sixth transistor is electrically connected to a gate of the fourth transistor. A gate of the second transistor is electrically connected to the gate of the fourth transistor. A gate of the fifth transistor is electrically connected to the gate of the first transistor. The one of the source and the drain of the first transistor is electrically connected to a first electrode of the MEMS device. The one of the source and the drain of the fourth transistor is electrically connected to a second electrode of the MEMS device.

One embodiment of the present invention is a semiconductor device including first to sixth transistors and a MEMS device. One of a source and a drain of the first transistor is electrically connected to one of a source and a drain of the second transistor. One of a source and a drain of the third transistor is electrically connected to a gate of the first transistor. One of a source and a drain of the fourth transistor is electrically connected to one of a source and a drain of the fifth transistor. One of a source and a drain of the sixth transistor is electrically connected to a gate of the fourth transistor. A gate of the second transistor is electrically connected to the one of the source and the drain of the fourth transistor. A gate of the fifth transistor is electrically connected to the one of the source and the drain of the first transistor. The one of the source and the drain of the first transistor is electrically connected to a first electrode of the MEMS device. The one of the source and the drain of the fourth transistor is electrically connected to a second electrode of the MEMS device.

In any of the above embodiments of the present invention, at least one of the first to sixth transistors may include a channel formation region in an oxide semiconductor layer.

The semiconductor device according to any of the above embodiments of the present invention may include a first capacitor and a second capacitor. A first electrode of the first capacitor is electrically connected to the one of the source and the drain of the first transistor. A second electrode of the first capacitor is electrically connected to the gate of the first transistor. A first electrode of the second capacitor is electrically connected to the one of the source and the drain of the fourth transistor. A second electrode of the second capacitor is electrically connected to the gate of the fourth transistor.

In any of the above embodiments of the present invention, the W/L ratio (W: channel width, L: channel length) of the first transistor may be higher than that of the second transistor. The W/L ratio of the fourth transistor may be higher than that of the fifth transistor.

In any of the above embodiments of the present invention, the W/L ratio of the first transistor may be higher than that of the third transistor. The W/L ratio of the fourth transistor may be higher than that of the sixth transistor.

One embodiment of the present invention is a display module including a display panel and an FPC. The display panel includes the semiconductor device according to any of the above embodiments of the present invention.

One embodiment of the present invention is an electronic device including the display module according to the above embodiment of the present invention and at least one of an antenna, an operation button, and a speaker.

Note that other embodiments of the present invention will be shown in Embodiments 1 to 3 and the drawings.

One embodiment of the present invention can provide a pixel, a semiconductor device, or a display device having a novel structure. One embodiment of the present invention can continuously apply voltage to a display element or provide a structure for achieving it. One embodiment of the present invention can decrease a signal amplitude voltage or provide a structure for achieving it. One embodiment of the present invention can precisely control the gray level of a display element or provide a structure for achieving it. One embodiment of the present invention can prevent current from being generated all the time or provide a structure for achieving it. One embodiment of the present invention can reduce power consumption or provide a structure for achieving it. One embodiment of the present invention can use only transistors of the same polarity or provide a structure for achieving it. One embodiment of the present invention can reduce the number of fabrication steps or provide a structure for achieving it. One embodiment of the present invention can shorten the time during which a shoot-through current occurs or provide a structure for achieving it. One embodiment of the present invention can reduce a shoot-through current or provide a structure for achieving it. One embodiment of the present invention can reduce the layout area or provide a structure for achieving it.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
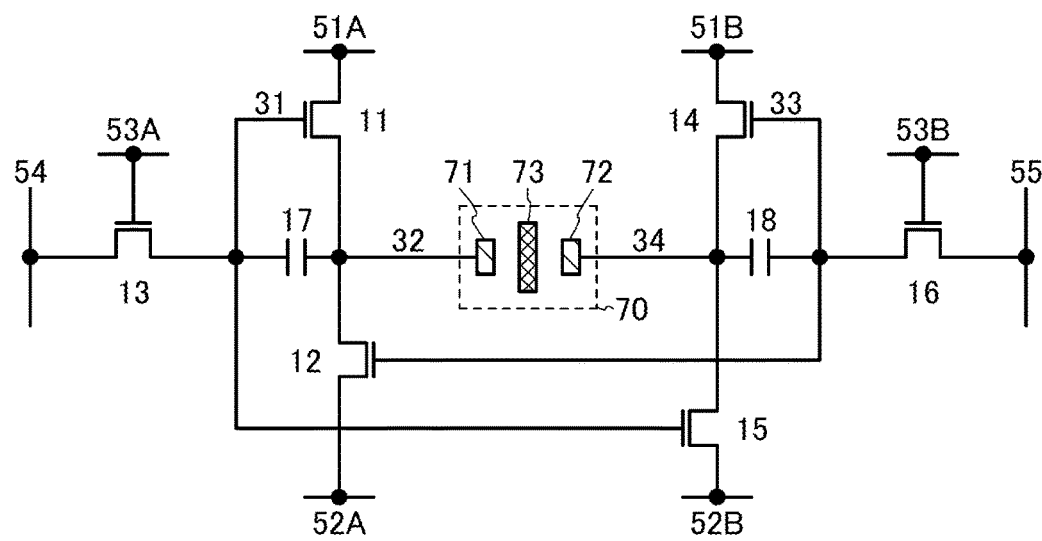
FIG. 1 illustrates an example of a semiconductor device.

Embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of the embodiments below.

One embodiment of the present invention includes, in its category, devices such as an imaging device, a radio frequency (RF) tag, a display device, and an integrated circuit. A display device includes, in its category, a display device including an integrated circuit, such as a liquid crystal display device, a light-emitting device in which a light-emitting element typified by an organic light-emitting element is provided in each pixel, electronic paper, a digital micromirror device (DMD), a plasma display panel (PDP), and a field emission display (FED).

In describing structures of the present invention with reference to the drawings, the same reference numerals are sometimes used in common for the same portions in different drawings.

In this specification and the like, part of a diagram or text described in one embodiment can be taken out to constitute one embodiment of the invention. Thus, in the case where a diagram or text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors), wirings, passive elements (e.g., capacitors), conductive layers, insulating layers, semiconductor layers, components, devices, operating methods, manufacturing methods, and the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

In the case where at least one specific example is described in a diagram or text in one embodiment in this specification and the like, it will be readily appreciated by those skilled in the art that a broader concept of the specific example can be derived. Therefore, in the case where at least one specific example is described in the diagram or the text in one embodiment, a broader concept of the specific example is disclosed as one embodiment of the invention, and one embodiment of the invention can be constituted. The embodiment of the invention is clear.

In this specification and the like, a content described in at least a diagram (or part of the diagram) is disclosed as one embodiment of the invention, and one embodiment of the invention can be constituted. Therefore, when a certain content is described in a diagram, the content is disclosed as one embodiment of the invention even when the content is not described with text, and one embodiment of the invention can be constituted. In a similar manner, part of a diagram, which is taken out from the diagram, is disclosed as one embodiment of the invention, and one embodiment of the invention can be constituted. The embodiment of the invention is clear.

In addition, contents that are not specified in any text or drawing in the specification can be excluded from one embodiment of the invention. Alternatively, when the range of a value that is defined by the maximum and minimum values is described, the range is appropriately narrowed or part of the range is removed, whereby one embodiment of the invention excluding part of the range can be constructed. In this manner, it can be specified that a conventional technology is excluded from the technical scope of one embodiment of the present invention, for example.

In this specification and the like, it might be possible for those skilled in the art to constitute one embodiment of the invention even when portions to which all the terminals of an active element (e.g., a transistor), a passive element (e.g., a capacitor), or the like are connected are not specified. In other words, one embodiment of the invention can be clear even when connection portions are not specified. Furthermore, in the case where a connection portion is disclosed in this specification and the like, it can be determined in some cases that one embodiment of the invention in which a connection portion is not specified is disclosed in this specification and the like. In particular, in the case where the number of portions to which the terminal is connected is more than one, it is not necessary to specify the portions to which the terminal is connected. Therefore, it might be possible to constitute one embodiment of the invention by specifying only portions to which some of terminals of an active element (e.g., a transistor), a passive element (e.g., a capacitor), or the like are connected.

In this specification and the like, it might be possible for those skilled in the art to specify the invention when at least the connection portion of a circuit is specified. It might be possible for those skilled in the art to specify the invention when at least a function of a circuit is specified. In other words, when a function of a circuit is specified, one embodiment of the invention can be clear. Furthermore, it can sometimes be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Moreover, when a function of a circuit is specified, the circuit is disclosed as one embodiment of the invention even when a connection portion is not specified, and one embodiment of the invention can be constituted.

In this specification and the like, when it is explicitly described that X and Y are connected, the case where X and Y are electrically connected, the case where X and Y are functionally connected, and the case where X and Y are directly connected are included therein. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, the explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

(Embodiment 1)

In this embodiment, an example of a semiconductor device according to one embodiment of the present invention will be described. The semiconductor device of one embodiment of the present invention can operate a MEMS device. When a MEMS device is used as a display element, the semiconductor device of one embodiment of the present invention can be used as a pixel in a display device.

FIG. 1 is a circuit diagram of a semiconductor device 10 according to one embodiment of the present invention. The semiconductor device 10 illustrated in FIG. 1 includes transistors 11 to 16, capacitors 17 and 18, and a MEMS device 70. The MEMS device 70 includes components 71 to 73.

A first terminal and a second terminal of the transistor 11 are connected to a wiring 51A and the component 71, respectively. A first terminal and a second terminal of the transistor 12 are connected to a wiring 52A and the component 71, respectively. A first terminal, a second terminal, and a gate of the transistor 13 are connected to a wiring 54, a gate of the transistor 11, and a wiring 53A, respectively. A first terminal and a second terminal of the transistor 14 are connected to a wiring 51B and the component 72, respectively. A first terminal and a second terminal of the transistor 15 are connected to a wiring 52B and the component 72, respectively. A first terminal, a second terminal, and a gate of the transistor 16 are connected to a wiring 55, a gate of the transistor 14, and a wiring 53B, respectively. A gate of the transistor 12 is connected to the gate of the transistor 14. A gate of the transistor 15 is connected to the gate of the transistor 11. A first electrode and a second electrode of the capacitor 17 are connected to the second terminal and the gate of the transistor 11, respectively. A first electrode and a second electrode of the capacitor 18 are connected to the second terminal and the gate of the transistor 14, respectively.

A node 31 is a portion where the gate of the transistor 11, the second terminal of the transistor 13, the gate of the transistor 15, and the second electrode of the capacitor 17 are connected. A node 32 is a portion where the second terminal of the transistor 11, the second terminal of the transistor 12, the first electrode of the capacitor 17, and the component 71 are connected. A node 33 is a portion where the gate of the transistor 14, the second terminal of the transistor 16, the gate of the transistor 12, and the second electrode of the capacitor 18 are connected. A node 34 is a portion where the second terminal of the transistor 14, the second terminal of the transistor 15, the first electrode of the capacitor 18 and the component 72 are connected.

The transistors 11 to 16 preferably have the same polarity. The transistors 11 to 16 are n-channel transistors in FIG. 1 but may be p-channel transistors.

A variety of signals, voltages, or the like can be supplied to the wirings 51A, 51B, 52A, 52B, 53A, 53B, 54, and 55 and wirings described later. The potentials of these wirings can be controlled by the signals, voltages, or the like supplied to the wirings. Moreover, the operation of the semiconductor device 10 can be controlled by the signals, voltages, or the like supplied to the wirings.

Figure 2A:
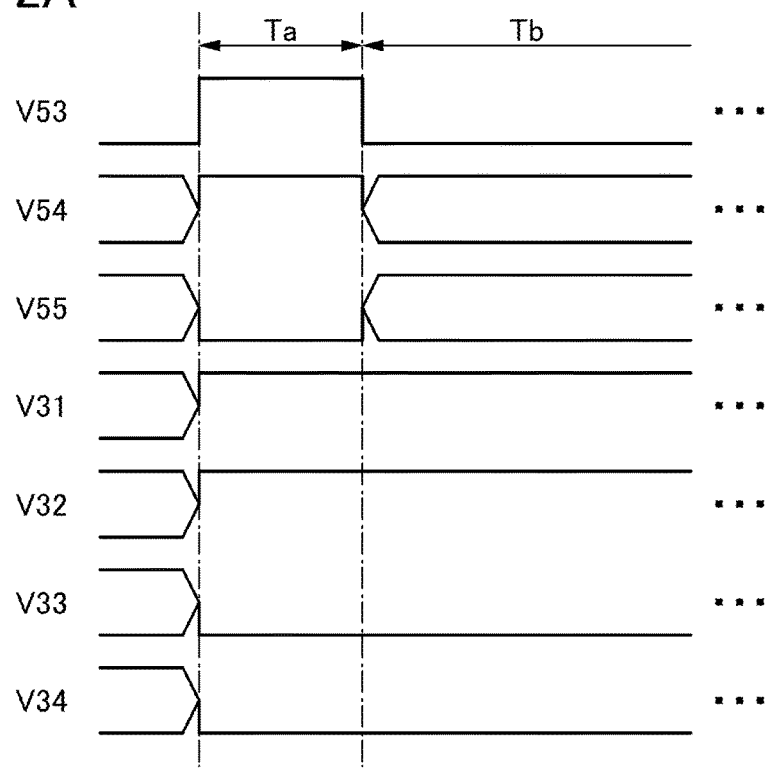
FIGS. 2A and 2B are timing charts.
Figure 2B:
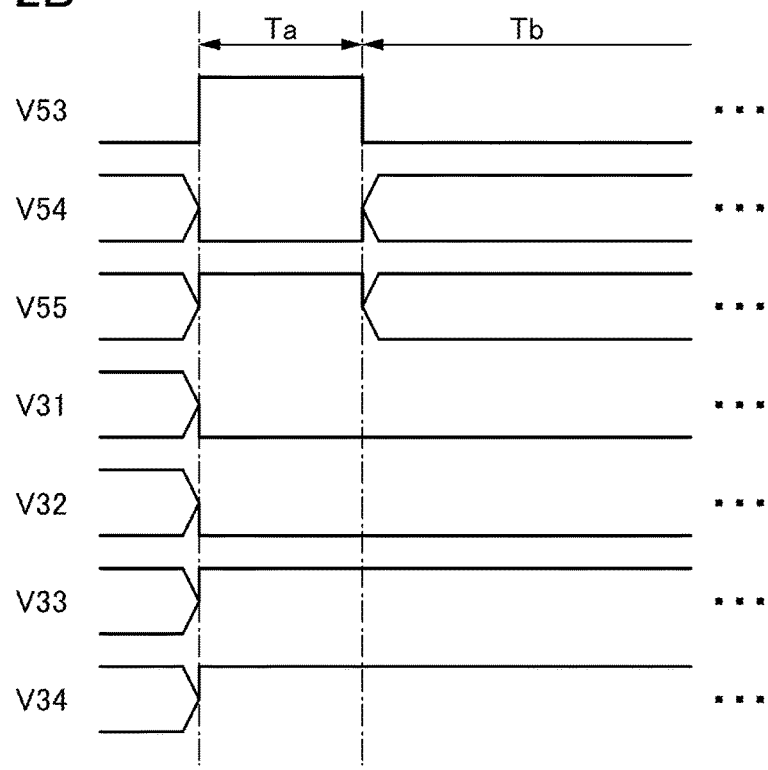

The description is made on the operation of the semiconductor device 10 in FIG. 1 that is controlled according to timing charts shown in FIGS. 2A and 2B. Note that the semiconductor device 10 in FIG. 1 can operate in various other manners by controlling the potentials of the wirings as appropriate.

FIGS. 2A and 2B show a potential V53 of the wirings 53A and 53B, a potential V54 of the wiring 54, a potential V55 of the wiring 55, a potential V31 of the node 31, a potential V32 of the node 32, a potential V33 of the node 33, and a potential V34 of the node 34. FIGS. 2A and 2B are different in that in a period Ta, the potential of the wiring 54 is high and that of the wiring 55 is low in FIG. 2A, whereas the potential of the wiring 54 is low and that of the wiring 55 is high in FIG. 2B.

In FIGS. 2A and 2B, signals are input to the wirings 53A and 53B, the wiring 54, and the wiring 55. A voltage VDD is supplied to the wirings 51A and 51B. A voltage VSS (VSS<VDD) is supplied to the wirings 52A and 52B and the component 73.

In the period Ta, the potentials of the wirings 53A and 53B become high, so that the transistors 13 and 16 are turned on. Electrical continuity is established between the node 31 and the wiring 54 through the transistor 13; thus, a signal is supplied to the node 31 from the wiring 54 through the transistor 13. The potential of the node 31 is controlled in response to the potential of the wiring 54. Furthermore, electrical continuity is established between the node 33 and the wiring 55 through the transistor 16; thus, a signal is supplied to the node 33 from the wiring 55 through the transistor 16. The potential of the node 33 is controlled in response to the potential of the wiring 55.

Figure 3A:
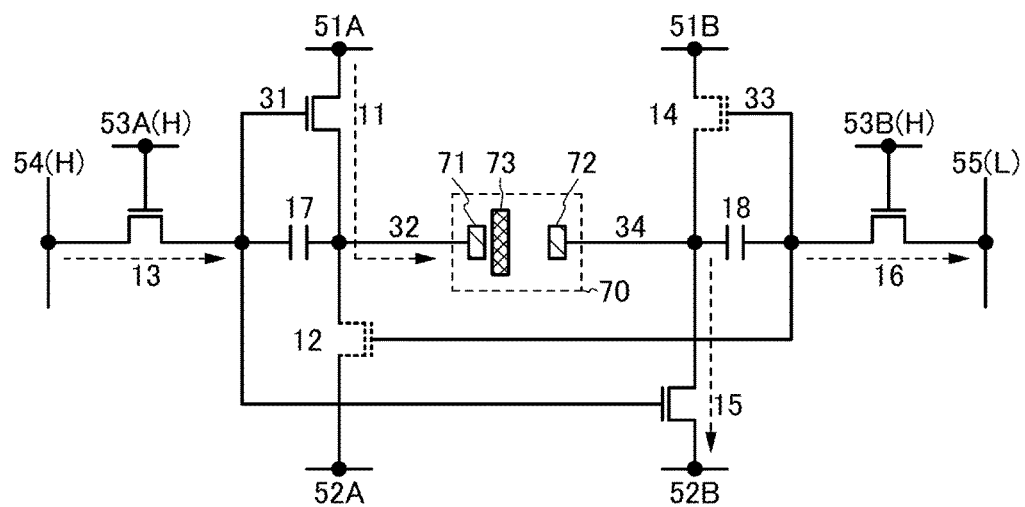
FIGS. 3A and 3B each illustrate an example of a semiconductor device.

In FIG. 2A, since the potential of the wiring 54 is high, the potential of the node 31 becomes high and thus, the transistors 11 and 15 are turned on. Since the potential of the wiring 55 is low, the potential of the node 33 becomes low and the transistors 12 and 14 are turned off as a result. Electrical continuity is established between the node 32 and the wiring 51A through the transistor 11; thus, the voltage VDD is supplied to the node 32 from the wiring 51A through the transistor 11, and the potential of the node 32 becomes high. Electrical continuity is established between the node 34 and the wiring 52B through the transistor 15, so that the voltage VSS is supplied to the node 34 from the wiring 52B through the transistor 15, and the potential of the node 34 becomes low. Consequently, a potential difference is generated between the component 71 and the component 73 but not between the component 72 and the component 73, so that the component 73 moves toward the component 71 (see FIG. 3A).

The potentials of the nodes 31 and 32 will be specifically described. When the potential of the node 31 increases to a value obtained by subtracting the threshold voltage of the transistor 13 from the gate potential of the transistor 13 (the high potential of the wiring 53A), the transistor 13 is turned off, so that the node 31 becomes floating. At this time, the capacitor 17 maintains a potential difference between the node 31 and the node 32. Consequently, the potential of the node 31 also rises along with the increase in potential of the node 32; this is called bootstrap operation. Then, when the potential of the node 31 exceeds the sum of the potential (VDD) of the first terminal of the transistor 11 and the threshold voltage of the transistor 11, the potential of the node 32 increases to VDD.

Figure 3B:
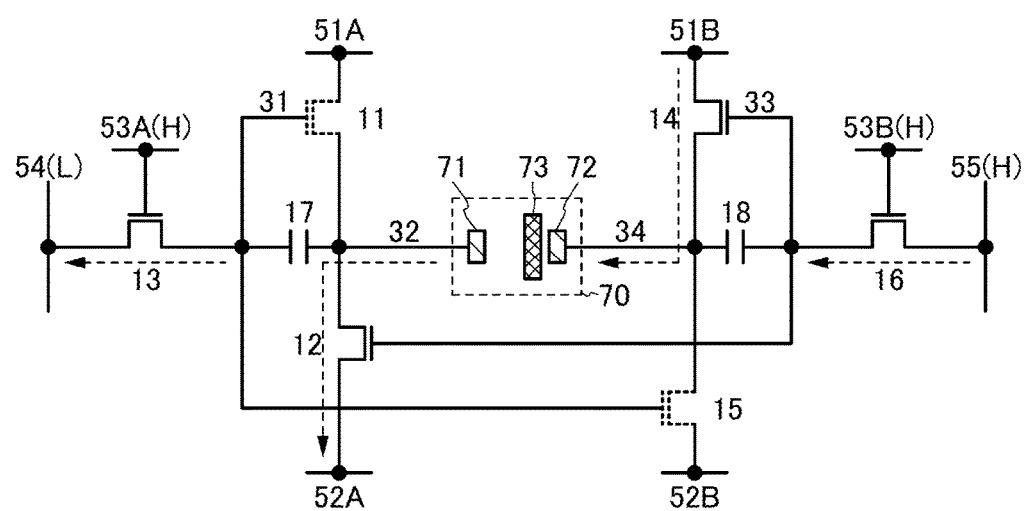

In FIG. 2B, since the potential of the wiring 54 is low, the potential of the node 31 becomes low and thus, the transistors 11 and 15 are turned off. Since the potential of the wiring 55 is high, the potential of the node 33 becomes high and the transistors 12 and 14 are turned on as a result. Electrical continuity is established between the node 32 and the wiring 52A through the transistor 12; thus, the voltage VSS is supplied to the node 32 from the wiring 52A through the transistor 12, and the potential of the node 32 becomes low. Electrical continuity is established between the node 34 and the wiring 51B through the transistor 14, so that the voltage VDD is supplied to the node 34 from the wiring 51B through the transistor 14, and the potential of the node 34 becomes high. Accordingly, a potential difference is generated between the component 72 and the component 73 but not between the component 71 and the component 73, so that the component 73 moves toward the component 72 (see FIG. 3B).

The potentials of the nodes 33 and 34 will be specifically described. When the potential of the node 33 increases to a value obtained by subtracting the threshold voltage of the transistor 16 from the gate potential of the transistor 16 (the high potential of the wiring 53B), the transistor 16 is turned off, so that the node 33 becomes floating. At this time, the capacitor 18 maintains a potential difference between the node 33 and the node 34. Consequently, the potential of the node 33 also rises along with the increase in potential of the node 34; this is called bootstrap operation. Then, when the potential of the node 33 exceeds the sum of the potential (VDD) of the first terminal of the transistor 14 and the threshold voltage of the transistor 14, the potential of the node 34 increases to VDD.

In a period Tb, the potentials of the wirings 53A and 53B become low, so that the transistors 13 and 16 are turned off. Since the nodes 31 and 33 become floating, the potentials of the nodes 31 and 33 remain the same as in the period Ta. Thus, the on/off states of the transistors 11, 12, 14, and 15 remain the same as in the period Ta.

Figure 4A:
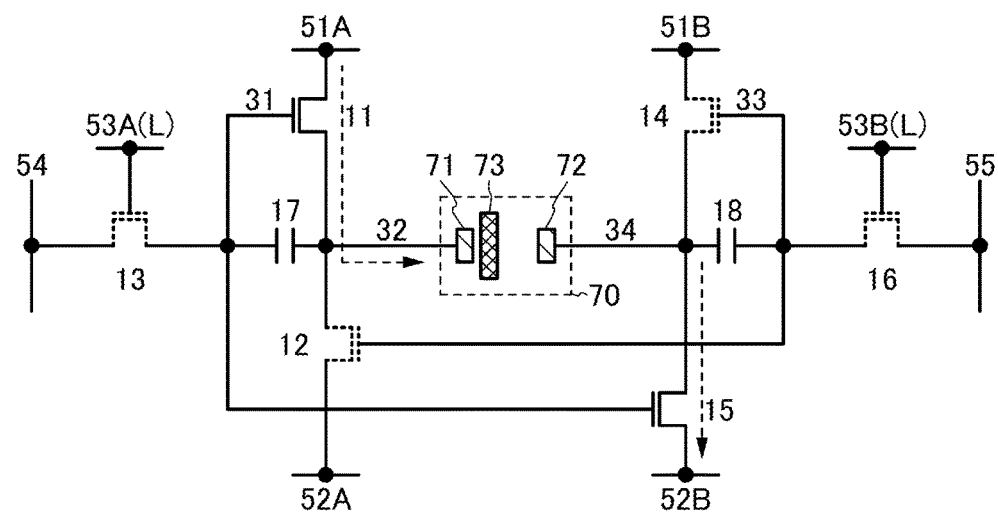
FIGS. 4A and 4B each illustrate an example of a semiconductor device.

In FIG. 2A, the transistors 11 and 15 are turned on because the node 31 remains high, and the transistors 12 and 14 are turned off because the node 33 remains low. Electrical continuity is established between the node 32 and the wiring 51A through the transistor 11; thus, the voltage VDD is supplied to the node 32 from the wiring 51A through the transistor 11, and the potential of the node 32 becomes high. Electrical continuity is established between the node 34 and the wiring 52B through the transistor 15, so that the voltage VSS is supplied to the node 34 from the wiring 52B through the transistor 15, and the potential of the node 34 becomes low. Consequently, a potential difference is generated between the component 71 and the component 73 but not between the component 72 and the component 73, so that the component 73 moves toward the component 71 (see FIG. 4A).

Figure 4B:
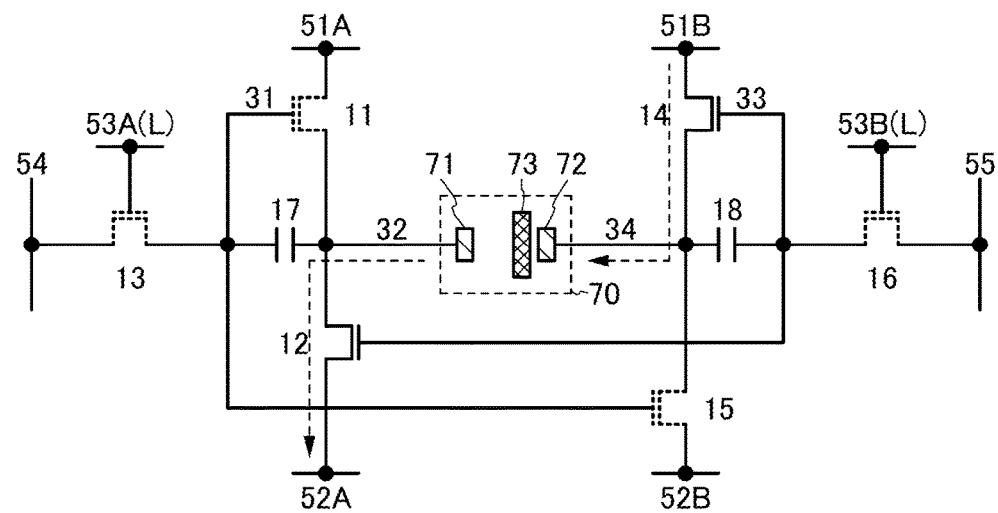

In FIG. 2B, the transistors 11 and 15 are turned off because the node 31 remains low, and the transistors 12 and 14 are turned on because the node 33 remains high. Electrical continuity is established between the node 32 and the wiring 52A through the transistor 12; thus, the voltage VSS is supplied to the node 32 from the wiring 52A through the transistor 12, and the potential of the node 32 becomes low. Electrical continuity is established between the node 34 and the wiring 51B through the transistor 14, so that the voltage VDD is supplied to the node 34 from the wiring 51B through the transistor 14, and the potential of the node 34 becomes high. Accordingly, a potential difference is generated between the component 72 and the component 73 but not between the component 71 and the component 73, so that the component 73 moves toward the component 72 (see FIG. 4B).

As described above, the semiconductor device 10 illustrated in FIG. 1 can control the MEMS device 70 as appropriate.

In the semiconductor device 10 of FIG. 1, the MEMS device 70, particularly the components 71 and 72, can be prevented from being floating. Thus, the change in voltage applied to the MEMS device 70 can be suppressed, and the MEMS device 70 can be precisely controlled.

In the semiconductor device 10 of FIG. 1, the bootstrap operation allows the potentials of the nodes 31 and 33 to be higher than VDD. Thus, the amplitude voltage of signals input to the wirings 54 and 55 can be reduced. A smaller amplitude voltage of signals input to the wirings 54 and 55 results in a smaller amplitude voltage of a signal input to the wiring 53. Consequently, power consumption can be reduced. Since the driving voltage of the MEMS device is usually high, the signal amplitude voltage is large and power consumption is large in many cases. In view of this, the effect of reducing power consumption by decreasing the signal amplitude voltage is effective particularly in a device using a MEMS device.

The semiconductor device of one embodiment of the present invention is not limited to that illustrated in FIG. 1. Modification examples of the semiconductor device 10 illustrated in FIG. 1 will be shown below.

MODIFICATION EXAMPLE 1

Figure 5A:
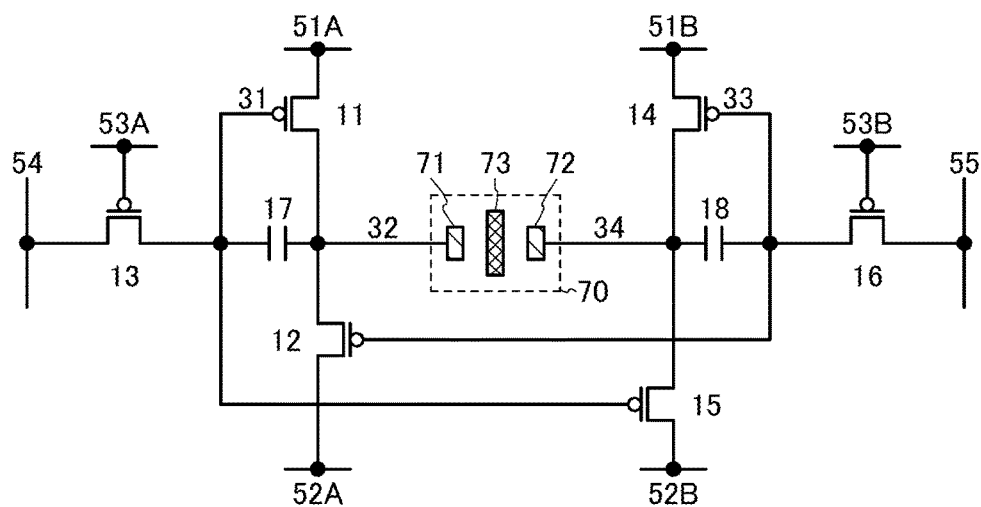
FIGS. 5A and 5B are a diagram illustrating an example of a semiconductor device and a timing chart.
Figure 5B:
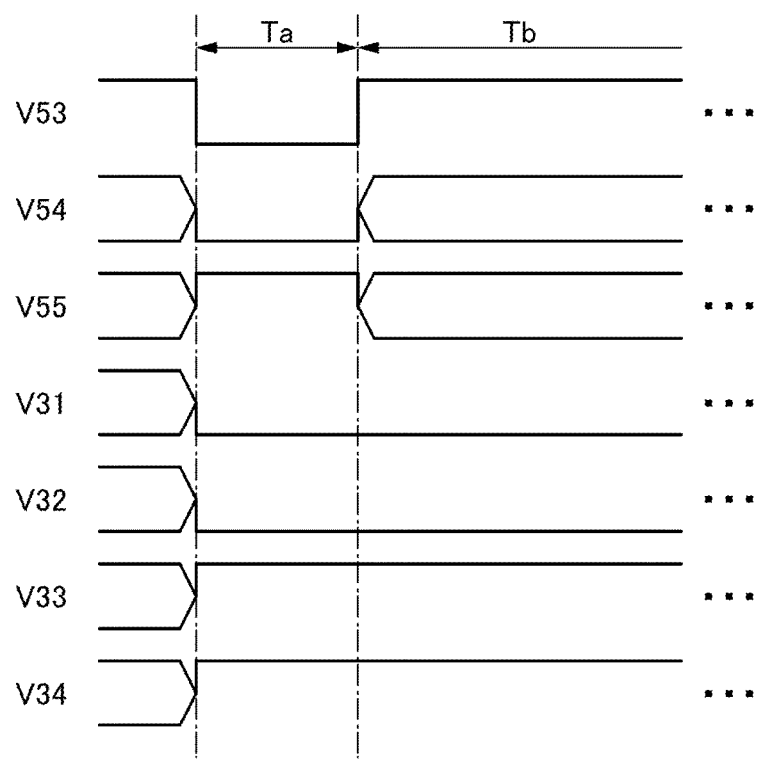

As illustrated in FIG. 5A, the transistors 11 to 16 in FIG. 1 can be p-channel transistors. When the transistors 11 to 16 are p-channel transistors, the potential levels of the wirings 53A, 53B, 54, and 55 are preferably set opposite to those in FIG. 2A or FIG. 2B. In a timing chart of FIG. 5B, the potential levels of the wirings 53A, 53B, 54, and 55 are opposite to those in FIG. 2A. It is preferred that the voltage VSS be supplied to the wirings 51A and 51B and the voltage VDD be supplied to the wirings 52A and 52B.

MODIFICATION EXAMPLE 2

Figure 6A:
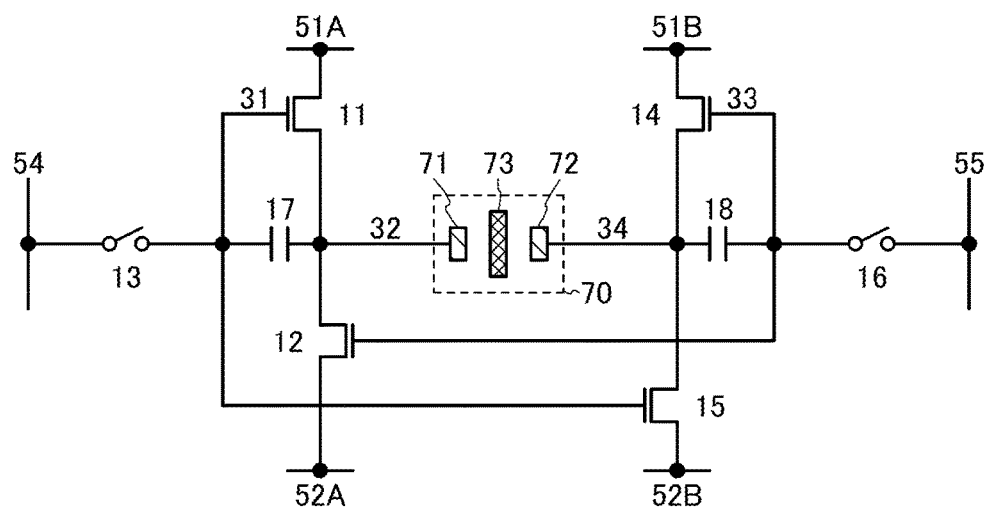
FIGS. 6A and 6B each illustrate an example of a semiconductor device.

As illustrated in FIG. 6A, the transistors 13 and 16 in FIG. 1 can be replaced with switches. The switch substituted for the transistor 13 has a first terminal connected to the wiring 54 and a second terminal connected to the node 31. The switch substituted for the transistor 16 has a first terminal connected to the wiring 55 and a second terminal connected to the node 33.

Alternatively, only one of the transistors 13 and 16 can be replaced with a switch.

Note that when a transistor is replaced with a switch, a first terminal of the switch is connected to where a first terminal of the transistor is connected, and a second terminal of the switch is connected to where a second terminal of the transistor is connected.

MODIFICATION EXAMPLE 3

Figure 6B:
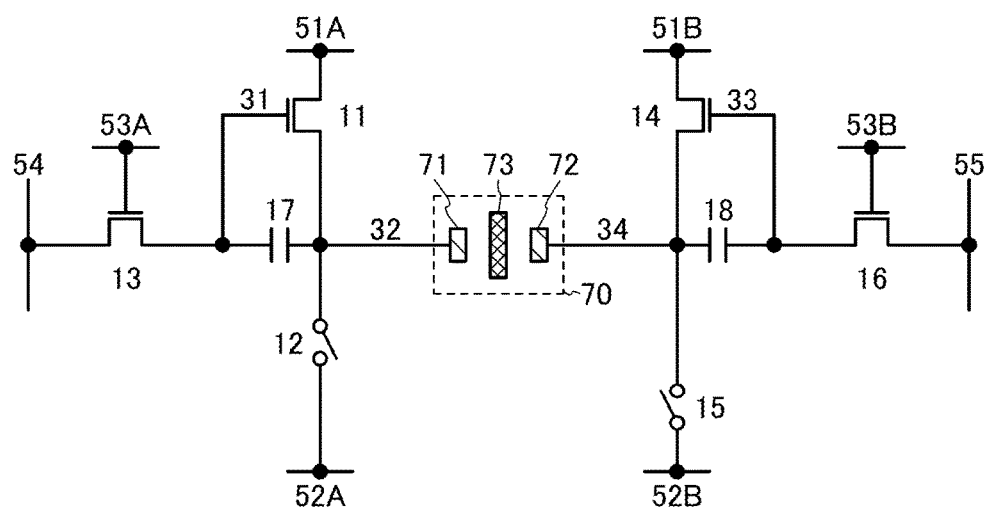

As illustrated in FIG. 6B, the transistors 12 and 15 in FIG. 1 can be replaced with switches. The switch substituted for the transistor 12 has a first terminal connected to the wiring 52A and a second terminal connected to the node 32. The switch substituted for the transistor 15 has a first terminal connected to the wiring 52B and a second terminal connected to the node 34.

Alternatively, only one of the transistors 12 and 15 can be replaced with a switch.

MODIFICATION EXAMPLE 4

Figure 7A:
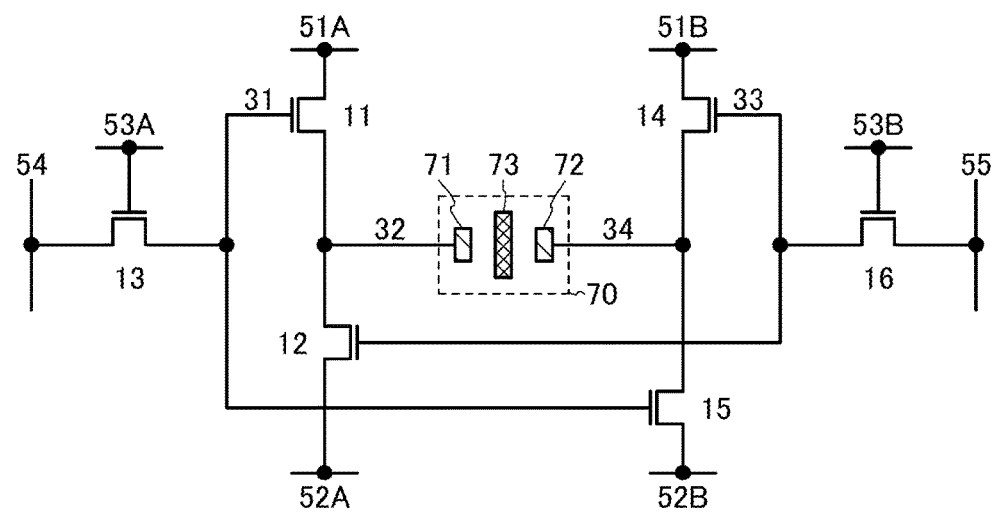
FIGS. 7A and 7B each illustrate an example of a semiconductor device.

As illustrated in FIG. 7A, the capacitors 17 and 18 in FIG. 1 can be omitted. The potential difference between the node 31 and the node 32 can be maintained by parasitic capacitance between the gate and the second terminal of the transistor 11. The potential difference between the node 33 and the node 34 can be maintained by parasitic capacitance between the gate and the second terminal of the transistor 14.

Alternatively, only one of the capacitors 17 and 18 can be omitted.

MODIFICATION EXAMPLE 5

Figure 7B:
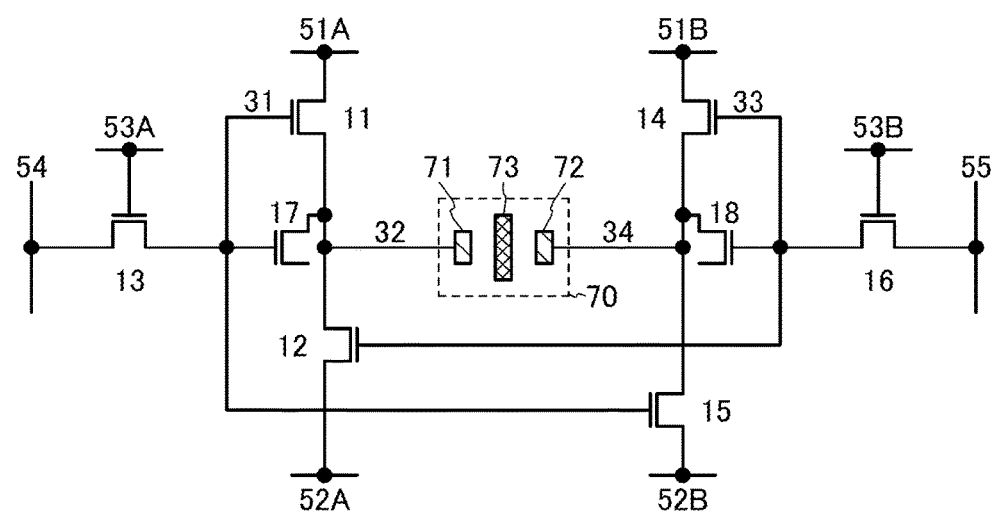

As illustrated in FIG. 7B, the capacitors 17 and 18 in FIG. 1 can be replaced with transistors. The transistor substituted for the capacitor 17 has a gate connected to the node 31 and a first terminal connected to the node 32. The transistor substituted for the capacitor 18 has a gate connected to the node 33 and a first terminal connected to the node 34.

Figure 8A:
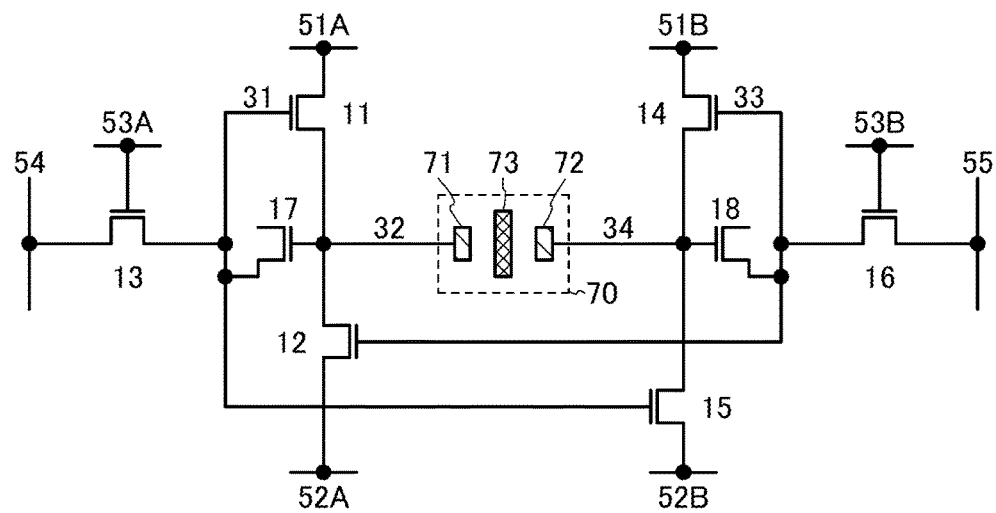
FIGS. 8A and 8B each illustrate an example of a semiconductor device.

As illustrated in FIG. 8A, the gate and the first terminal of the transistor substituted for the capacitor 17 can be connected to the node 32 and the node 31, respectively. The gate and the first terminal of the transistor substituted for the capacitor 18 can be connected to the node 34 and the node 33, respectively.

Alternatively, only one of the capacitors 17 and 18 can be replaced with a transistor.

Note that the transistors substituted for the capacitors 17 and 18 can have the same polarity as the transistors 11 to 16.

Note that a second terminal of the transistor substituted for the capacitor 17 can be connected to the first terminal thereof, and a second terminal of the transistor substituted for the capacitor 18 can be connected to the first terminal thereof.

MODIFICATION EXAMPLE 6

Figure 8B:
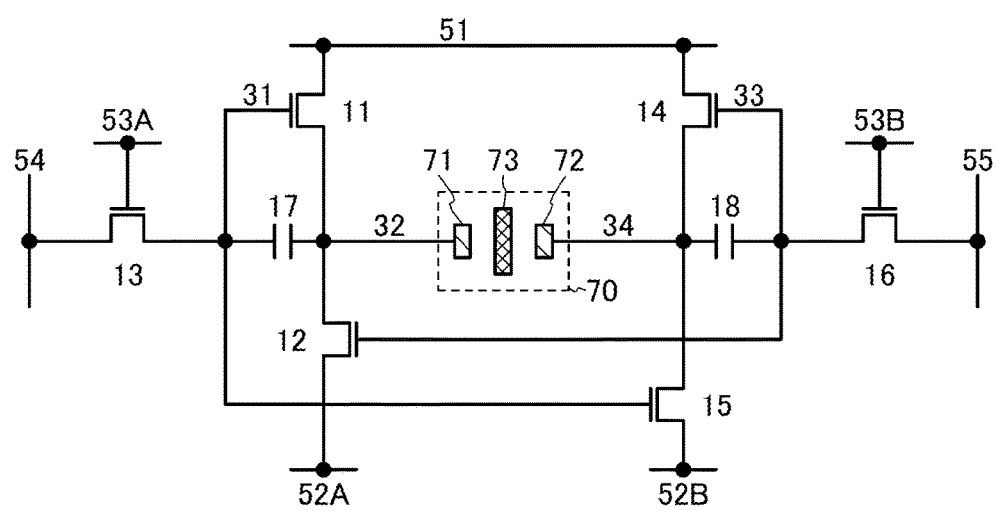

As illustrated in FIG. 8B, the wiring 51A and the wiring 51B in FIG. 1 can be one wiring 51. Various signals, voltages, or the like can be supplied to the wiring 51. Like the wirings 51A and 51B, the wiring 51 is preferably supplied with the voltage VDD.

MODIFICATION EXAMPLE 7

Figure 9A:
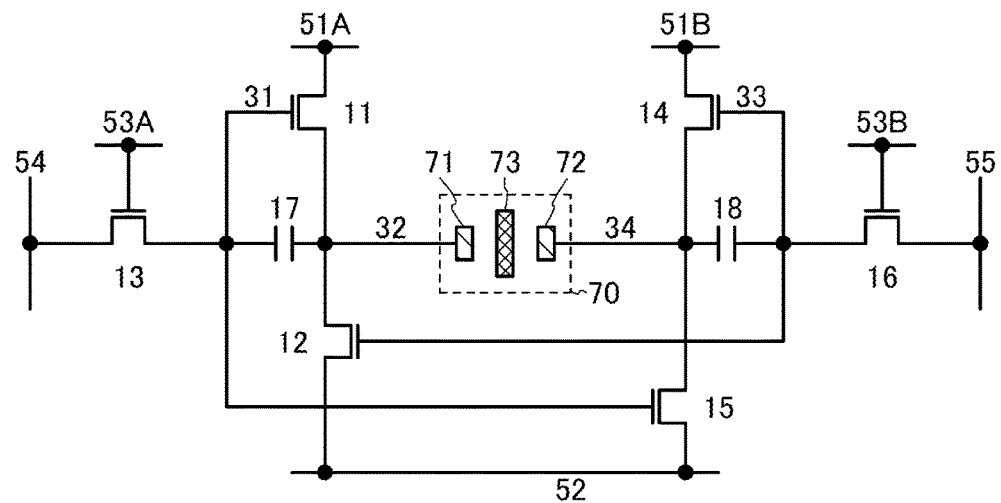
FIGS. 9A and 9B each illustrate an example of a semiconductor device.

As illustrated in FIG. 9A, the wiring 52A and the wiring 52B in FIG. 1 can be one wiring 52. Various signals, voltages, or the like can be supplied to the wiring 52. Like the wirings 52A and 52B, the wiring 52 is preferably supplied with the voltage VSS.

MODIFICATION EXAMPLE 8

Figure 9B:
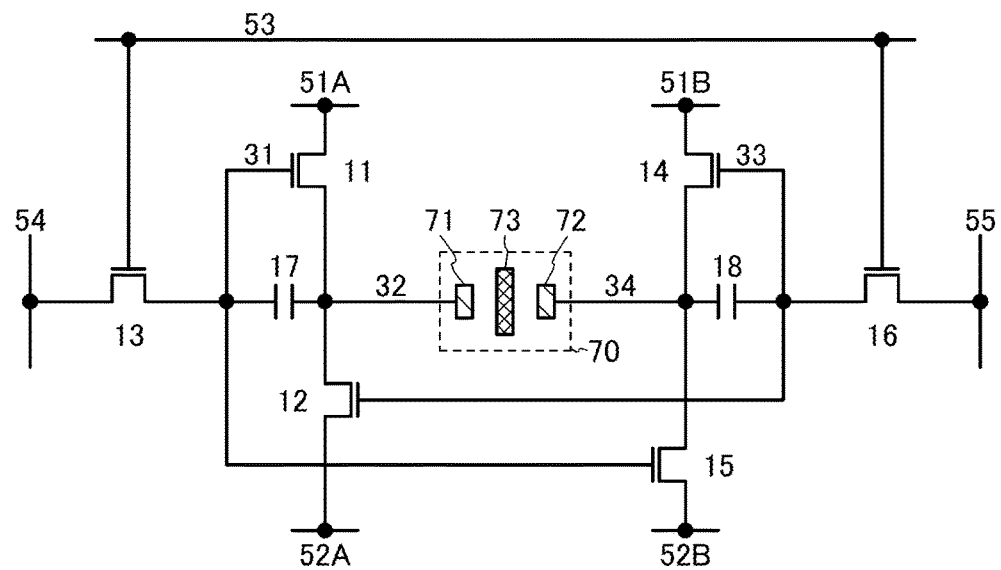

As illustrated in FIG. 9B, the wiring 53A and the wiring 53B in FIG. 1 can be one wiring 53. Various signals, voltages, or the like can be supplied to the wiring 53. It is preferred that a signal be input to the wiring 53 and the potential of the wiring 53 be controlled in a manner similar to that of the potential V53 in FIGS. 2A and 2B.

MODIFICATION EXAMPLE 9

Figure 10A:
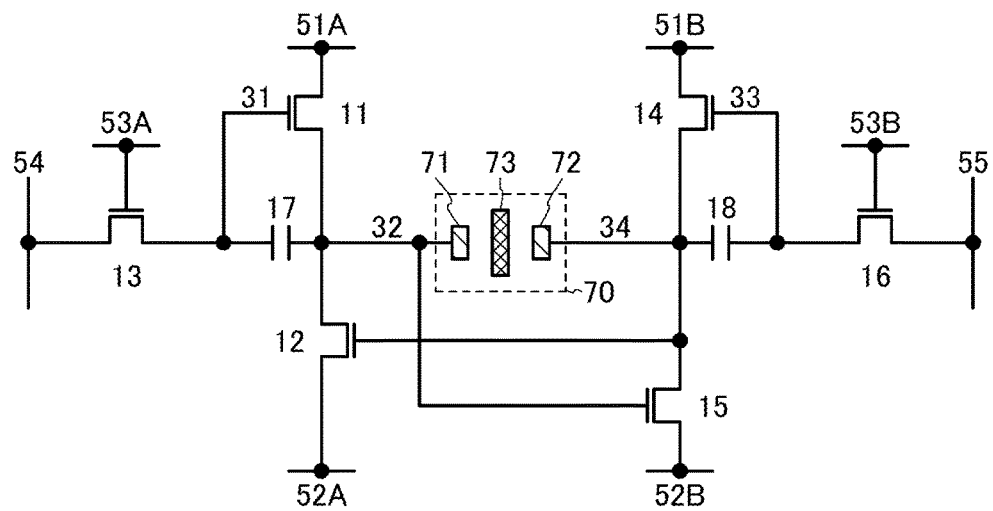
FIGS. 10A and 10B each illustrate an example of a semiconductor device.

As illustrated in FIG. 10A, the gate of the transistor 12 and the gate of the transistor 15 in FIG. 1 can be connected to the node 34 and the node 32, respectively. In the periods Ta and Tb of FIG. 2A, the node 32 becomes high and the node 34 becomes low; thus, the transistor 12 is turned off and the transistor 15 is turned on. In contrast, in the periods Ta and Tb of FIG. 2B, the node 32 becomes low and the node 34 becomes high, so that the transistor 12 is turned on and the transistor 15 is turned off. The potentials of the nodes 32 and 34 do not become as high as those of the nodes 31 and 33. Accordingly, a voltage applied to the transistors 12 and 15 can be decreased, whereby deterioration of the transistors 12 and 15 can be suppressed and breakdown of the transistors 12 and 15 can be prevented.

MODIFICATION EXAMPLE 10

Figure 10B:
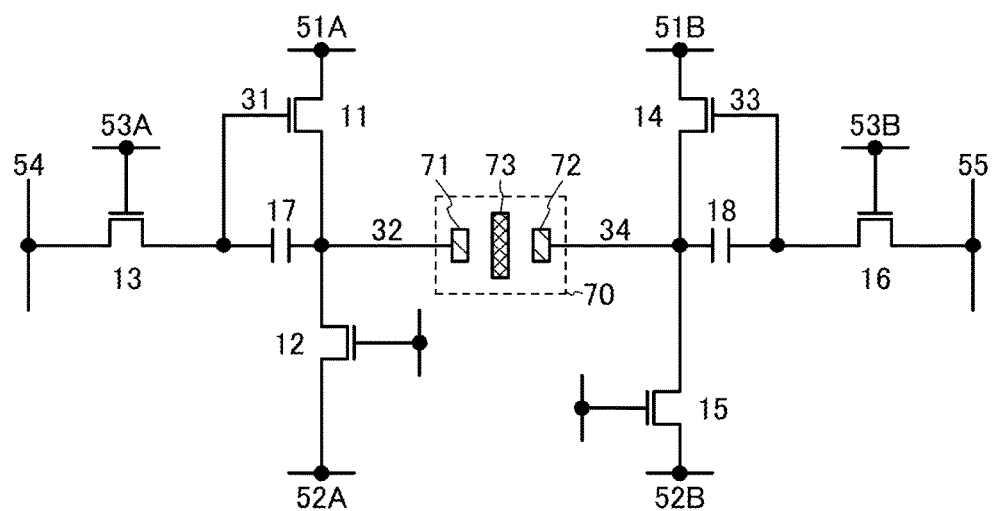

As illustrated in FIG. 10B, the gate of each of the transistors 12 and 15 in FIG. 1 can be connected to a wiring different from the wirings 51A, 51B, 52A, 52B, 53A, 53B, 54, and 55.

Note that the gate of the transistor 12 and the gate of the transistor 15 can be connected to each other.

MODIFICATION EXAMPLE 11

Figure 11A:
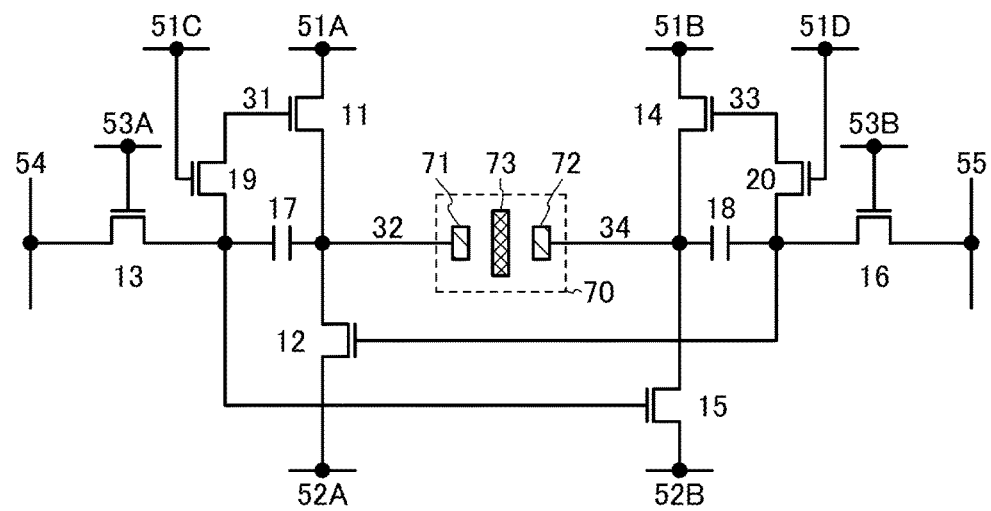
FIGS. 11A and 11B each illustrate an example of a semiconductor device.

As illustrated in FIG. 11A, transistors 19 and 20 can be provided in FIG. 1. A first terminal, a second terminal, and a gate of the transistor 19 are connected to the gate of the transistor 11, the second terminal of the transistor 13, and a wiring 51C, respectively. A first terminal, a second terminal, and a gate of the transistor 20 are connected to the gate of the transistor 14, the second terminal of the transistor 16, and a wiring 51D, respectively. The gate of the transistor 15 is connected to the second terminal of the transistor 19. The gate of the transistor 12 is connected to the second terminal of the transistor 20. Various signals, voltages, or the like can be supplied to the wirings 51C and 51D. The wirings 51C and 51D are preferably supplied with the voltage VDD but may be supplied with a voltage lower than the voltage VDD. In the case where the potential of the node 31 increases to a value higher than VDD due to the bootstrap operation, the transistor 19 is turned off when the potential of the second terminal of the transistor 13 becomes a value obtained by subtracting the threshold voltage of the transistor 19 from the gate potential (VDD) of the transistor 19. Thus, the potential of the second terminal of the transistor 13 does not become as high as that of the node 31. In contrast, in the case where the potential of the node 31 becomes low, the transistor 19 remains on and the potential of the second terminal of the transistor 13 becomes low. In the case where the potential of the node 33 increases to a value higher than VDD due to the bootstrap operation, the transistor 20 is turned off when the potential of the second terminal of the transistor 16 becomes a value obtained by subtracting the threshold voltage of the transistor 20 from the gate potential (VDD) of the transistor 20. Thus, the potential of the second terminal of the transistor 16 does not become as high as that of the node 33. In contrast, in the case where the potential of the node 33 becomes low, the transistor 20 remains on and the potential of the second terminal of the transistor 16 becomes low. In such a manner, the increase in potentials of the second terminal of the transistor 13 and the second terminal of the transistor 16 can be suppressed. Accordingly, a voltage applied to the transistors 13 and 16 can be decreased, preventing deterioration and breakdown of the transistors 13 and 16. Furthermore, a voltage applied to the transistors 12 and 15 can be decreased, preventing deterioration and breakdown of the transistors 12 and 15.

Figure 11B:
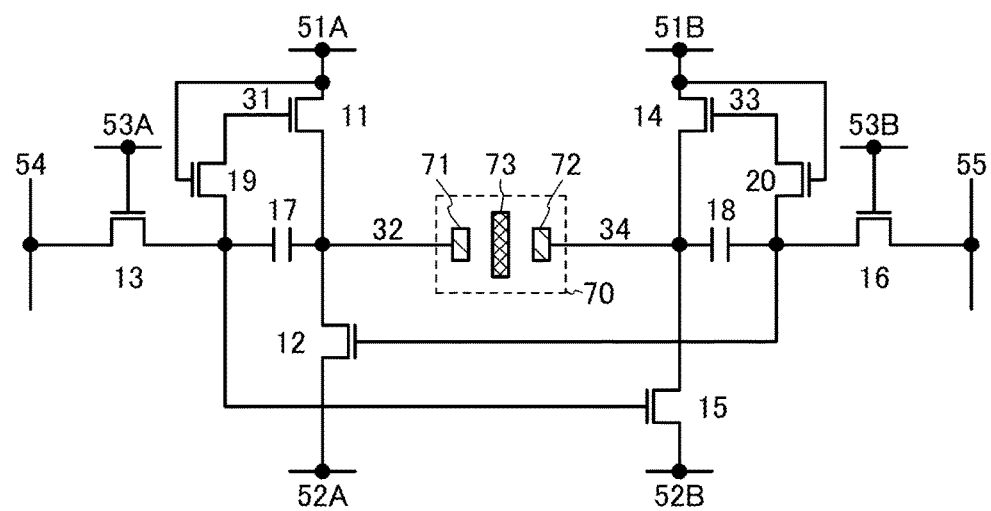

As illustrated in FIG. 11B, the gate of the transistor 19 can be connected to the wiring 51A and the gate of the transistor 20 can be connected to the wiring 51B. In this case, the first terminal of the transistor 11, the first terminal of the transistor 14, the gate of the transistor 19, and the gate of the transistor 20 can be connected to the wiring 51.

Figure 12A:
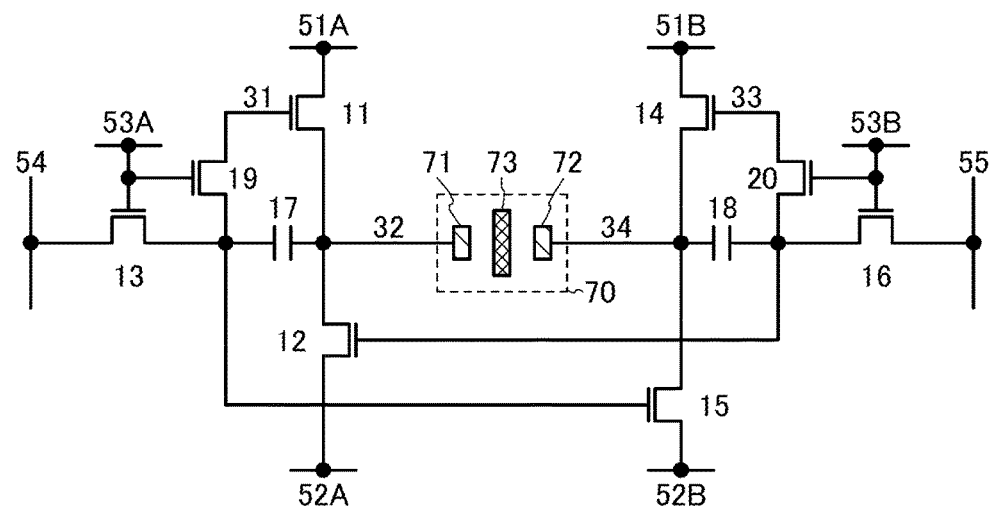
FIGS. 12A and 12B each illustrate an example of a semiconductor device.

As illustrated in FIG. 12A, the gate of the transistor 19 can be connected to the wiring 53A and the gate of the transistor 20 can be connected to the wiring 53B. In this case, the gate of the transistor 13, the gate of the transistor 16, the gate of the transistor 19, and the gate of the transistor 20 can be connected to the wiring 53.

Note that the wirings 51C and 51D can be one wiring. The potential of the one wiring can be controlled independently of the wirings 51A, 51B, 53A, and 53B.

Figure 12B:
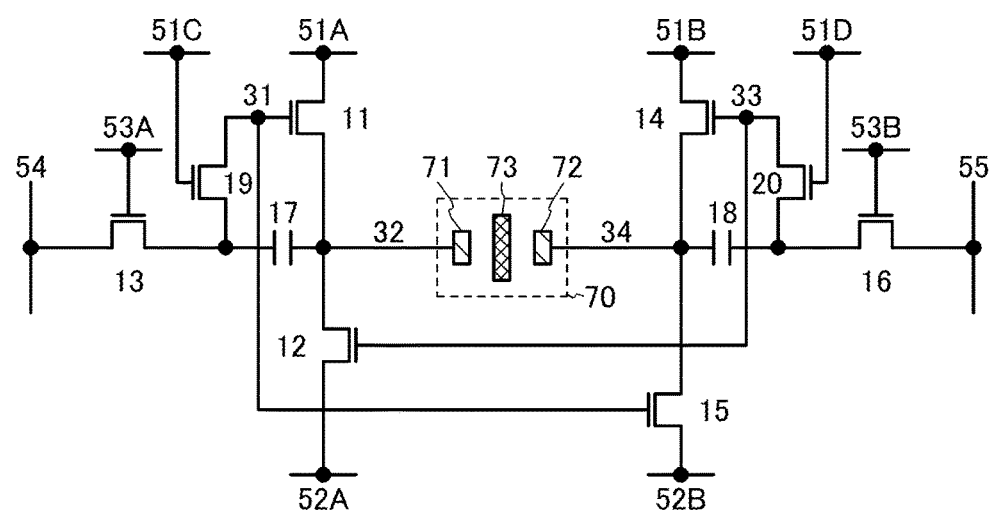

As illustrated in FIG. 12B, the gate of the transistor 15 can be connected to the first terminal of the transistor 19 and the gate of the transistor 12 can be connected to the first terminal of the transistor 20.

Note that only one of the transistors 19 and 20 may be provided.

Note that the transistors 19 and 20 preferably have the same polarity as the transistors 11 to 16.

MODIFICATION EXAMPLE 12

Figure 13A:
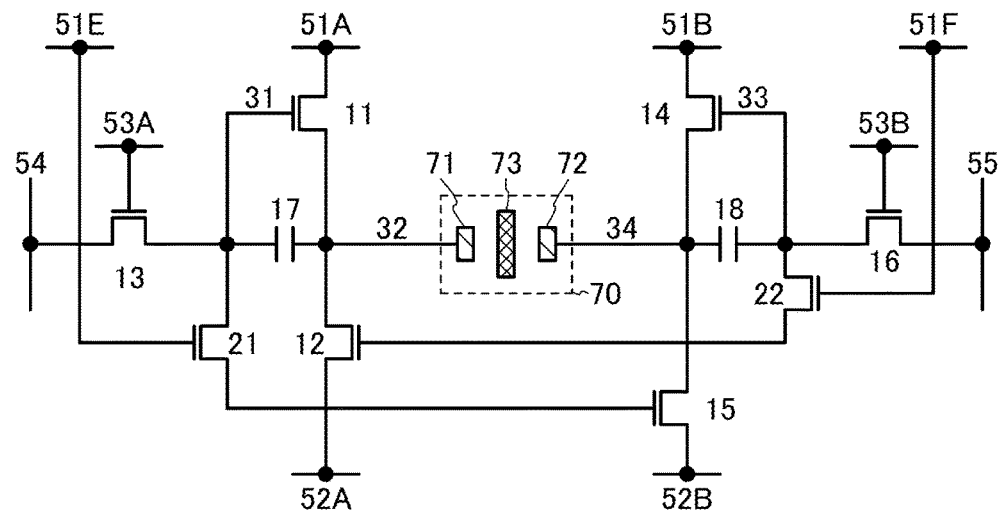
FIGS. 13A and 13B each illustrate an example of a semiconductor device.

As illustrated in FIG. 13A, transistors 21 and 22 can be provided in FIG. 1. A first terminal, a second terminal, and a gate of the transistor 21 are connected to the gate of the transistor 15, the node 31, and a wiring 51E, respectively. A first terminal, a second terminal, and a gate of the transistor 22 are connected to the gate of the transistor 12, the node 33, and a wiring 51F, respectively. Various signals, voltages, or the like can be supplied to the wirings 51E and 51F. The wirings 51E and 51F are preferably supplied with the voltage VDD but may be supplied with a voltage lower than the voltage VDD. In the case where the potential of the node 31 increases to a value higher than VDD due to the bootstrap operation, the transistor 21 is turned off when the gate potential of the transistor 15 becomes a value obtained by subtracting the threshold voltage of the transistor 21 from the gate potential (VDD) of the transistor 21. Thus, the gate potential of the transistor 15 does not become as high as that of the node 31. In contrast, in the case where the potential of the node 31 becomes low, the transistor 21 remains on and the gate potential of the transistor 15 becomes low. In the case where the potential of the node 33 increases to a value higher than VDD due to the bootstrap operation, the transistor 22 is turned off when the gate potential of the transistor 12 becomes a value obtained by subtracting the threshold voltage of the transistor 22 from the gate potential (VDD) of the transistor 22. Thus, the gate potential of the transistor 12 does not become as high as that of the node 33. In contrast, in the case where the potential of the node 33 becomes low, the transistor 22 remains on and the gate potential of the transistor 12 becomes low. In such a manner, the increase in gate potentials of the transistors 12 and 15 can be suppressed. Accordingly, a voltage applied to the transistors 12 and 15 can be decreased, preventing deterioration and breakdown of the transistors 12 and 15.

Figure 13B:
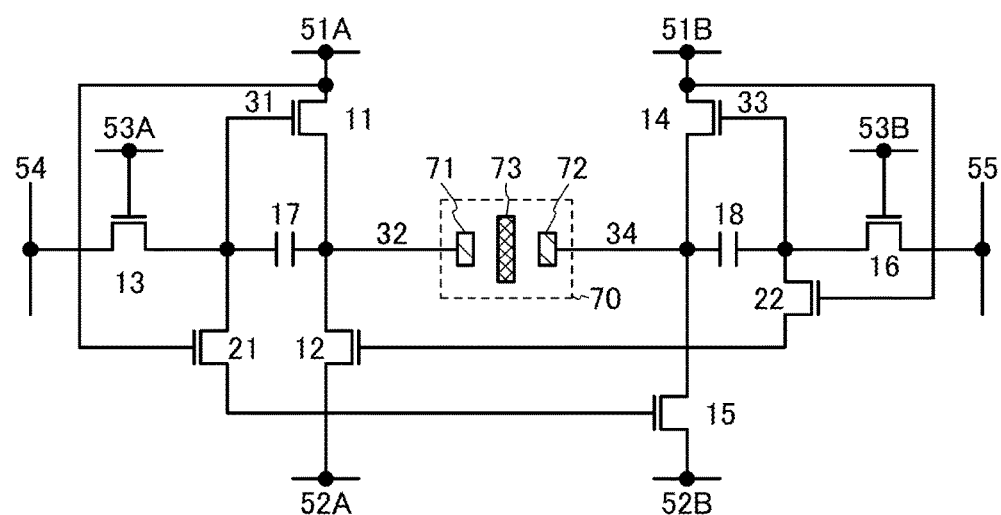

As illustrated in FIG. 13B, the gate of the transistor 21 can be connected to the wiring 51A and the gate of the transistor 22 can be connected to the wiring 51B. In this case, the first terminal of the transistor 11, the first terminal of the transistor 14, the gate of the transistor 21, and the gate of the transistor 22 can be connected to the wiring 51.

Figure 14A:
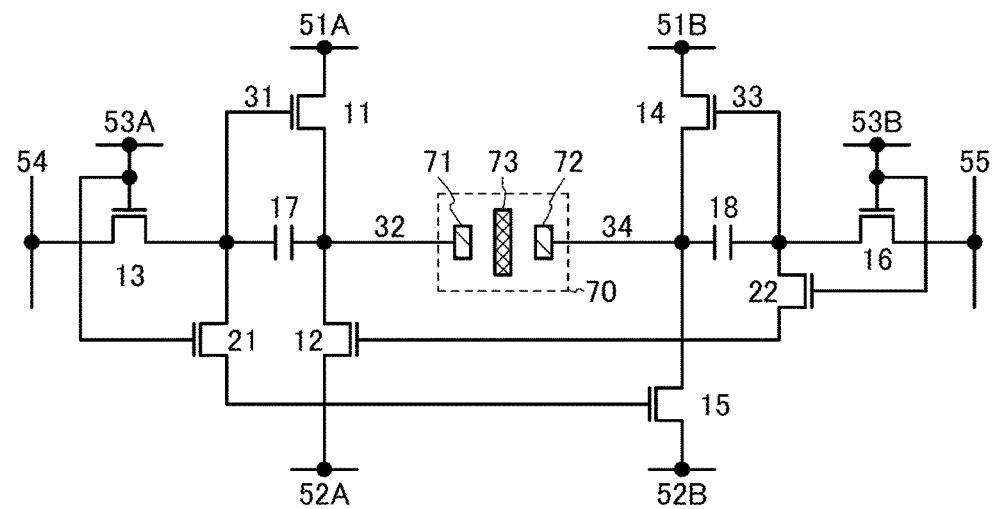
FIGS. 14A and 14B each illustrate an example of a semiconductor device.

As illustrated in FIG. 14A, the gate of the transistor 21 can be connected to the wiring 53A and the gate of the transistor 22 can be connected to the wiring 53B. In this case, the gate of the transistor 13, the gate of the transistor 16, the gate of the transistor 21, and the gate of the transistor 22 can be connected to the wiring 53.

Note that the wirings 51E and 51F can be one wiring. The potential of the one wiring can be controlled independently of the wirings 51A, 51B, 53A, and 53B.

Note that only one of the transistors 21 and 22 may be provided.

Note that the transistors 21 and 22 preferably have the same polarity as the transistors 11 to 16.

MODIFICATION EXAMPLE 13

Figure 14B:
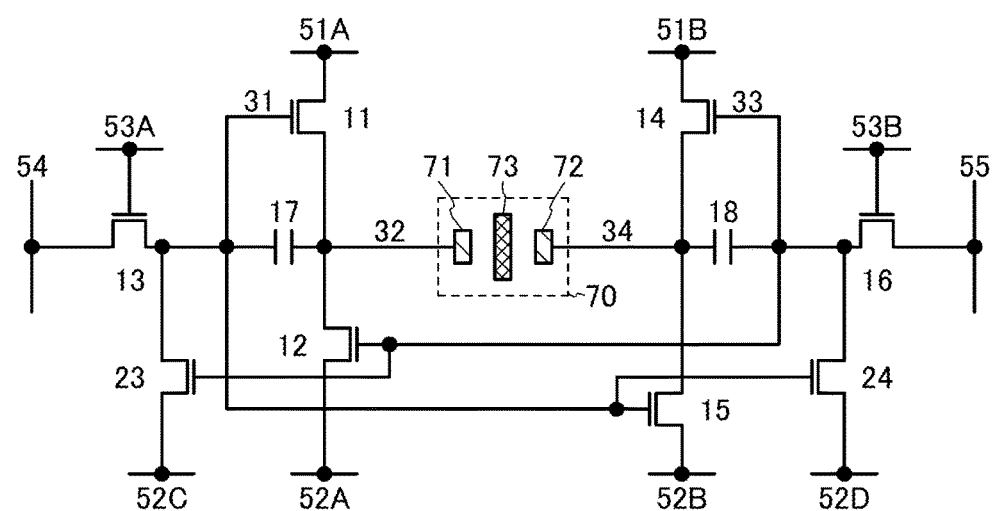

As illustrated in FIG. 14B, transistors 23 and 24 can be provided in FIG. 1. A first terminal, a second terminal, and a gate of the transistor 23 are connected to a wiring 52C, the node 31, and the node 33, respectively. A first terminal, a second terminal, and a gate of the transistor 24 are connected to a wiring 52D, the node 33, the node 31, respectively. Various signals, voltages, or the like can be supplied to the wirings 52C and 52D. The wirings 52C and 52D are preferably supplied with the voltage VSS. When the potential of the node 31 becomes high and the potential of the node 33 becomes low, the transistor 23 is turned off and the transistor 24 is turned on. Thus, electrical continuity is established between the node 33 and the wiring 52D through the transistor 24. In contrast, when the potential of the node 31 becomes low and the potential of the node 33 becomes high, the transistor 23 is turned on and the transistor 24 is turned off. Thus, electrical continuity is established between the node 31 and the wiring 52C through the transistor 23. The potentials of the nodes 31 and 33 can be easily maintained in such a manner; consequently, a malfunction can be prevented. Furthermore, the refresh rate can be decreased, resulting in lower power consumption.

Figure 15A:
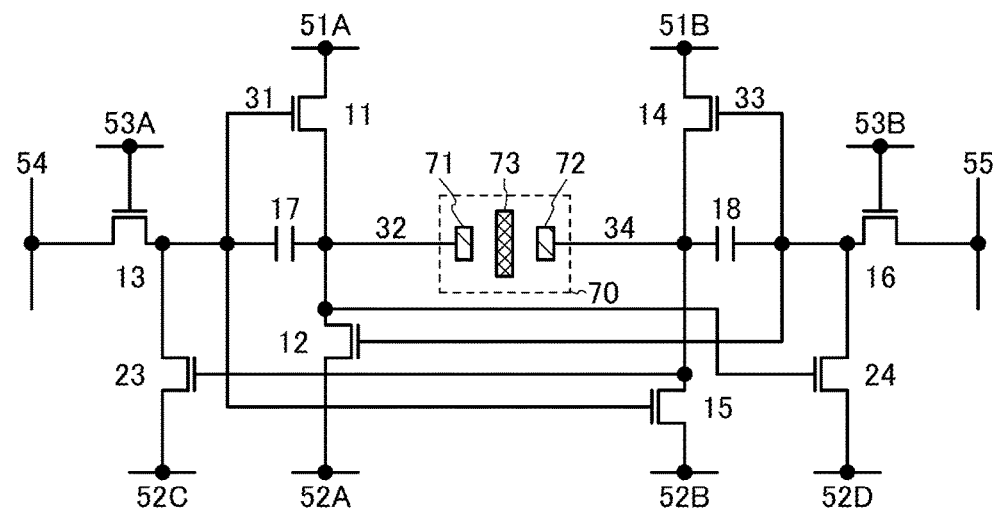
FIGS. 15A and 15B each illustrate an example of a semiconductor device.

As illustrated in FIG. 15A, the gate of the transistor 23 and the gate of the transistor 24 can be connected to the node 34 and the node 32, respectively. Accordingly, a voltage applied to the transistors 23 and 24 can be decreased, preventing deterioration and breakdown of the transistors 23 and 24.

Figure 15B:
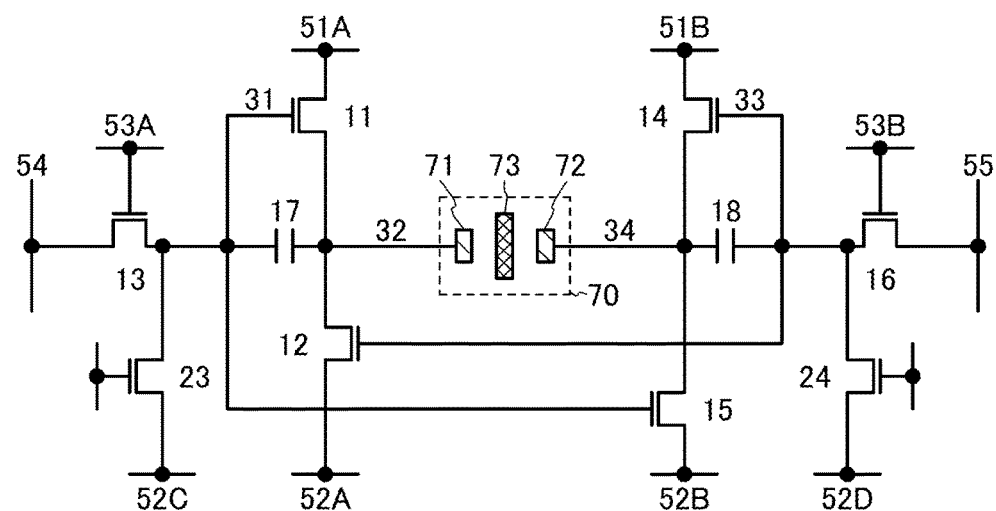

As illustrated in FIG. 15B, the gate of each of the transistors 23 and 24 can be connected to a wiring different from the wirings 51A, 51B, 52A, 52B, 53A, 53B, 54, and 55.

Figure 16A:
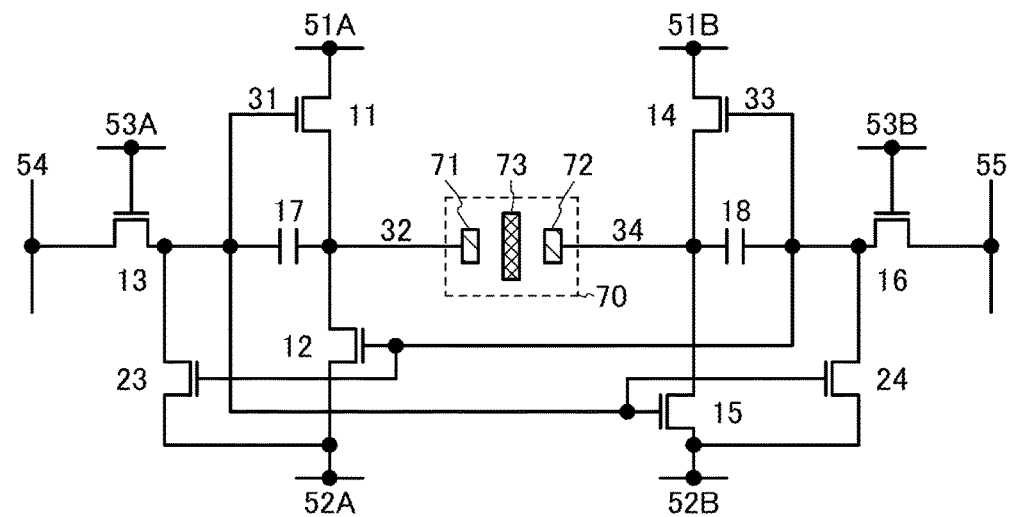
FIGS. 16A and 16B each illustrate an example of a semiconductor device.

As illustrated in FIG. 16A, the first terminal of the transistor 23 can be connected to the wiring 52A and the first terminal of the transistor 24 can be connected to the wiring 52B. In this case, the first terminal of the transistor 12, the first terminal of the transistor 15, the first terminal of the transistor 23, and the first terminal of the transistor 24 can be connected to the wiring 52.

Figure 16B:
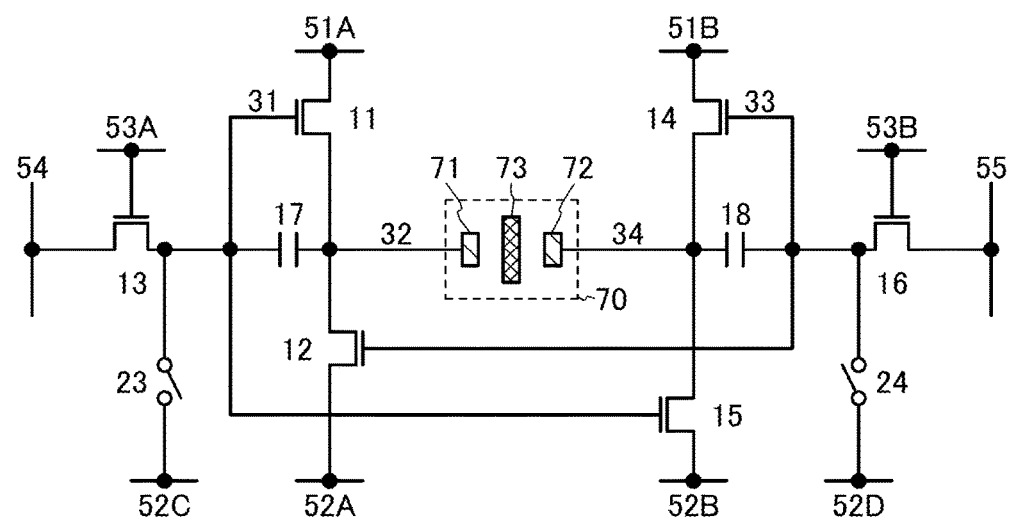

As illustrated in FIG. 16B, the transistors 23 and 24 can be replaced with switches.

Note that only one of the transistors 23 and 24 may be provided.

Note that the transistors 23 and 24 preferably have the same polarity as the transistors 11 to 16.

MODIFICATION EXAMPLE 14

Figure 17A:
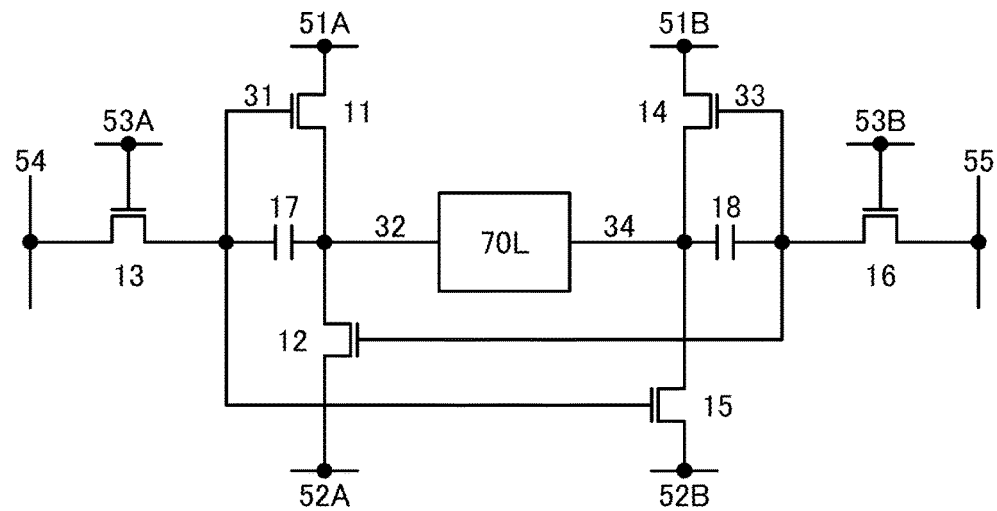
FIGS. 17A and 17B each illustrate an example of a semiconductor device.

As illustrated in FIG. 17A, the MEMS device 70 in FIG. 1 can be replaced with a load 70L. Alternatively, the MEMS device 70 can be omitted in FIG. 1.

MODIFICATION EXAMPLE 15

Figure 17B:
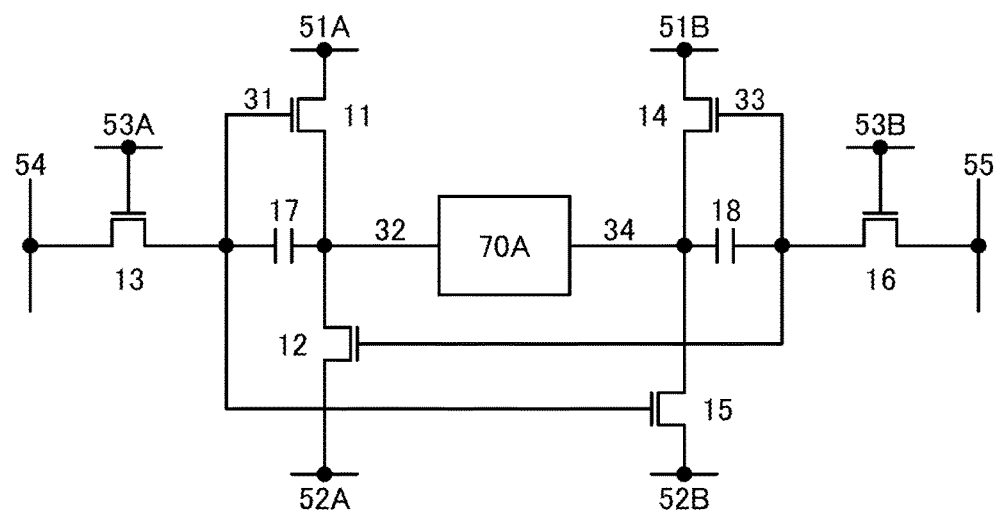

As illustrated in FIG. 17B, the MEMS device 70 in FIG. 1 can be replaced with a display element 70A.

Figure 18A:
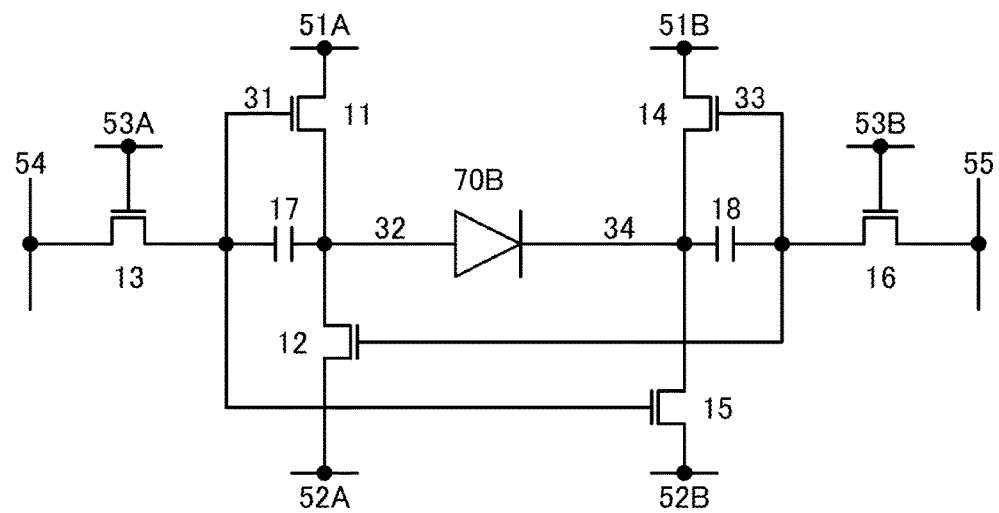
FIGS. 18A and 18B each illustrate an example of a semiconductor device.

FIG. 18A illustrates a configuration where a light-emitting element 70B is used as the display element 70A. The light-emitting element 70B includes a first electrode, a second electrode, and a light-emitting layer that has a region sandwiched between the first electrode and the second electrode (e.g., a layer containing an organic compound). The first electrode is connected to the node 32, and the second electrode is connected to the node 34.

As the display element 70A, a liquid crystal element can be used. The liquid crystal element includes a first electrode, a second electrode, and a liquid crystal element that has a region sandwiched between the first electrode and the second electrode. Alternatively, the liquid crystal element includes a first electrode, a second electrode, and a liquid crystal layer controlled by an electric field generated between the first electrode and the second electrode. The first electrode is connected to the node 32, and the second electrode is connected to the node 34.

For example, in this specification and the like, a display element, a display device including a display element, a light-emitting element, and a light-emitting device including a light-emitting element can employ a variety of modes or can include a variety of elements. A display element, a display device, a light-emitting element, or a light-emitting device includes, for example, at least one of an electroluminescent (EL) element (e.g., an EL element including organic and inorganic materials, an organic EL element, or an inorganic EL element), an LED (e.g., a white LED, a red LED, a green LED, or a blue LED), a transistor (a transistor that emits light corresponding to current), an electron emitter, a liquid crystal element, electronic ink, an electrophoretic element, a grating light valve (GLV), a plasma display panel (PDP), a display element using MEMS, a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements include electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. Note that in the case of using an LED, graphene or graphite may be provided under an electrode or a nitride semiconductor of the LED. Graphene or graphite may be a multilayer film in which a plurality of layers are stacked. When graphene or graphite is provided in this manner, a nitride semiconductor, for example, an n-type GaN semiconductor layer including crystals can be easily formed thereover. Furthermore, a p-type GaN semiconductor layer including crystals or the like can be provided thereover, and thus the LED can be formed. Note that an MN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

Figure 31:
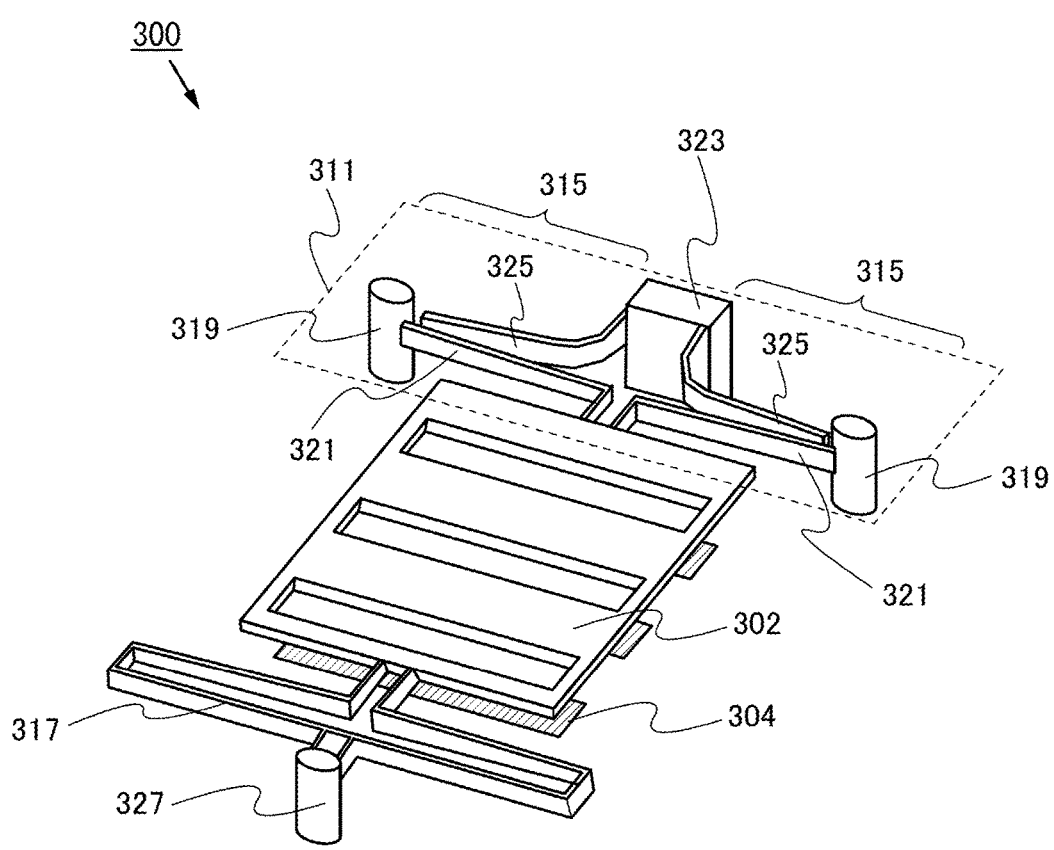
FIG. 31 illustrates an example of a MEMS device.

An example of the structure of a MEMS shutter is described. FIG. 31 illustrates a shutter 300. The shutter 300 includes a movable light-blocking layer 302 bonded to an actuator 311. The actuator 311 is provided over a light-blocking layer (not illustrated for simplicity) having an opening 304 and includes two flexible actuators 315. A side of the movable light-blocking layer 302 is electrically connected to the actuators 315. The actuators 315 have a function of moving the movable light-blocking layer 302 in the direction of the line connecting a structure body 323 and a structure body 327.

The actuators 315 each include a movable electrode 321 electrically connected to the movable light-blocking layer 302 and a structure body 319, and a movable electrode 325 electrically connected to the structure body 323. The movable electrode 325 is adjacent to the movable electrode 321. One end of the movable electrode 325 is electrically connected to the structure body 323, and the other end thereof can move freely. The other end of the movable electrode 325, which can move freely, is curved so as to be closest to the movable electrode 321 in the vicinity of a connection portion of the movable electrode 321 and the structure body 319.

The other side of the movable light-blocking layer 302 is connected to a spring 317 having restoring force to resist force applied by the actuator 311. The spring 317 is connected to the structure body 327.

The structure body 319, the structure body 323, and the structure body 327 function as mechanical supports to make the movable light-blocking layer 302, the actuators 315, and the spring 317 float in the vicinity of the surface of the light-blocking layer having the opening 304.

Under the movable light-blocking layer 302, the opening 304 surrounded by the light-blocking layer is placed. Note that the shapes of the movable light-blocking layer 302 and the opening 304 are not limited to these.

The structure body 323 included in the shutter 300 is electrically connected to a transistor (not illustrated). The transistor drives the movable light-blocking layer. Thus, a given voltage can be applied through the transistor to the movable electrode 325 connected to the structure body 323. The structure bodies 319 and 327 are connected to a ground electrode (GND). Accordingly, the movable electrode 321 connected to the structure body 319 and the spring 317 connected to the structure body 327 each have a potential of GND. Note that the structure bodies 319 and 327 may be electrically connected to a common electrode to which a given voltage can be applied. The structure bodies 319 and 327 may be replaced with another actuator 311 so that the shutter includes the two actuators 311.

When a voltage is applied to the movable electrode 325, the movable electrode 325 and the movable electrode 321 are electrically attracted to each other by a potential difference therebetween. As a result, the movable light-blocking layer 302 connected to the movable electrode 321 is drawn toward the structure body 323 and moves to the structure body 323. Since the movable electrode 321 serves as a spring, when the potential difference between the movable electrodes 321 and 325 is eliminated, the movable electrode 321 releases the stress accumulated therein so that the movable light-blocking layer 302 returns to its original position. When the movable electrode 321 is drawn to the movable electrode 325, the movable light-blocking layer 302 may block the opening 304 or may be positioned so as not to overlap the opening 304.

The structure body 323 is connected to the node 32 or the node 34.

MODIFICATION EXAMPLE 16

Figure 18B:
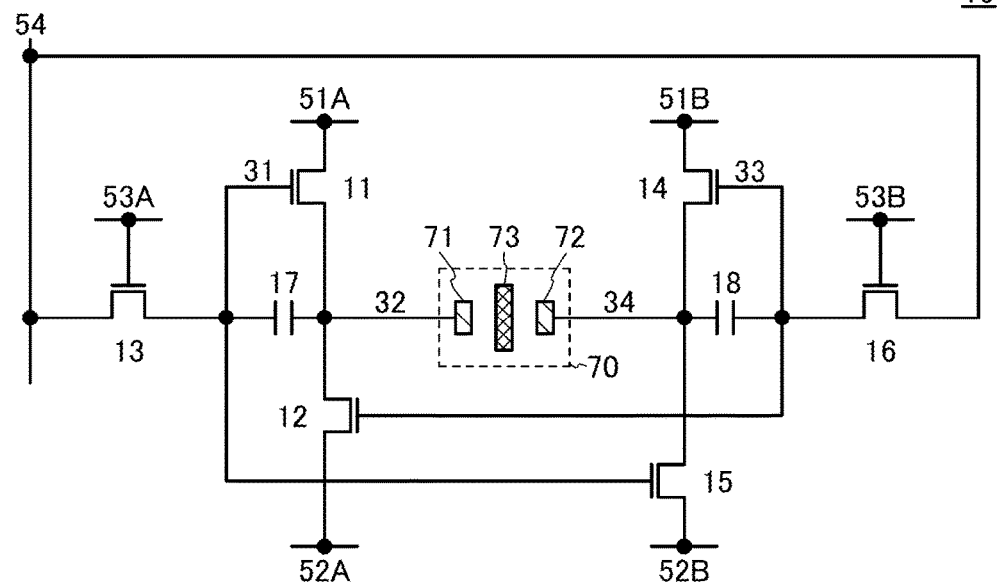

As illustrated in FIG. 18B, the first terminal of the transistor 13 in FIG. 1 can be connected to a wiring to which the first terminal of the transistor 16 is connected. In FIG. 18B, turning on the transistors 13 and 16 in different periods enables different signals to be supplied to the nodes 31 and 33 from the wiring 54.

The potentials of the wirings 53A and 53B are preferably controlled independently in order to turn on the transistors 13 and 16 in different periods. That is, the wirings 53A and 53B are preferably separate wirings.

A combination of at least two of the above modification examples can be applied to FIG. 1. At least two parts of the above modification examples can be combined as appropriate.

Figure 19A:
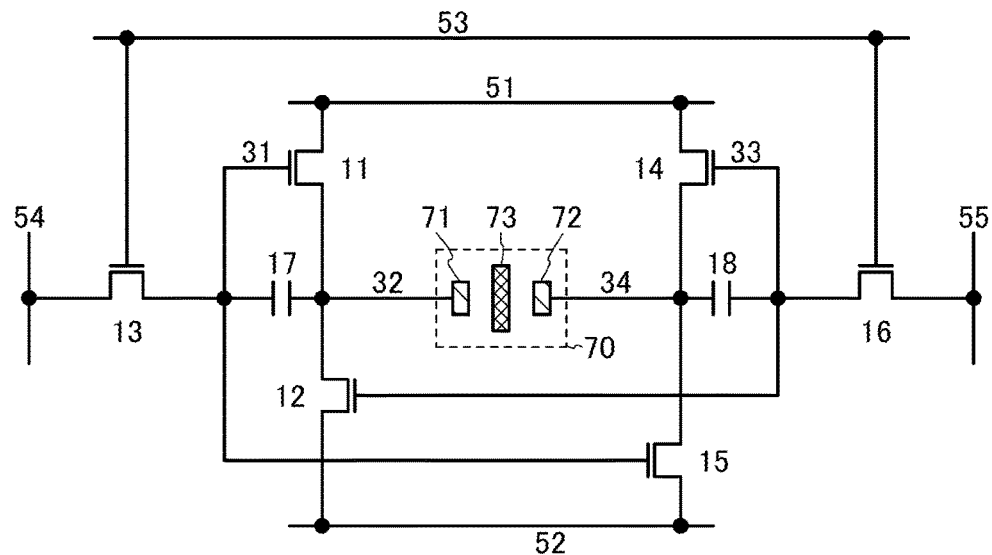
FIGS. 19A and 19B each illustrate an example of a semiconductor device.

In FIG. 1, the wiring 51A and the wiring 51B can be one wiring 51, the wirings 52A and 52B can be one wiring 52, and the wirings 53A and 53B can be one wiring 53 (see FIG. 19A).

Figure 19B:
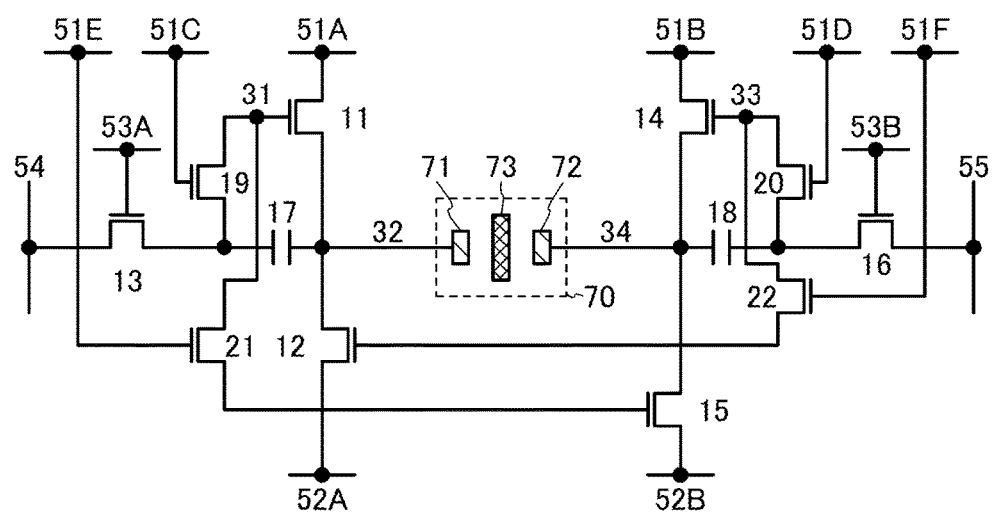
Figure 20A:
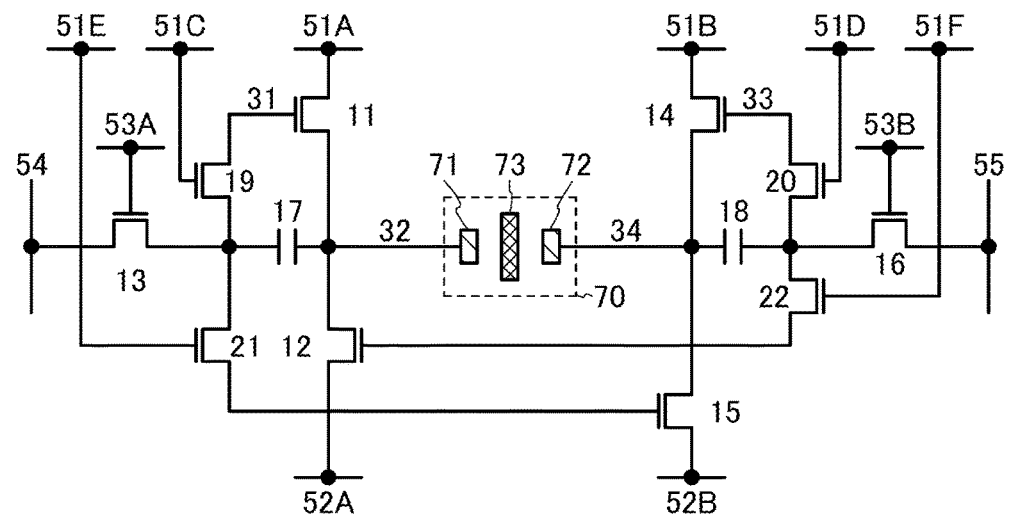
FIGS. 20A and 20B each illustrate an example of a semiconductor device.
Figure 20B:
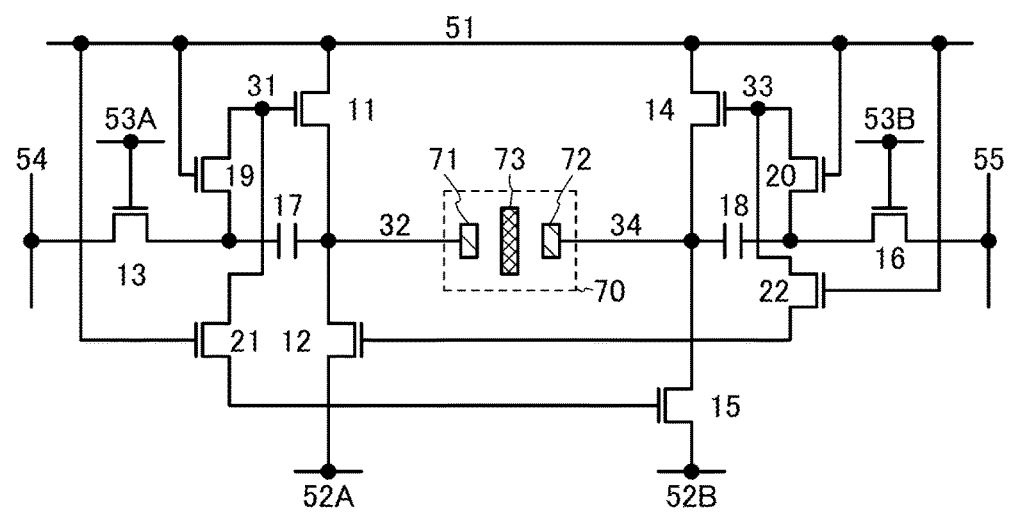
Figure 21A:
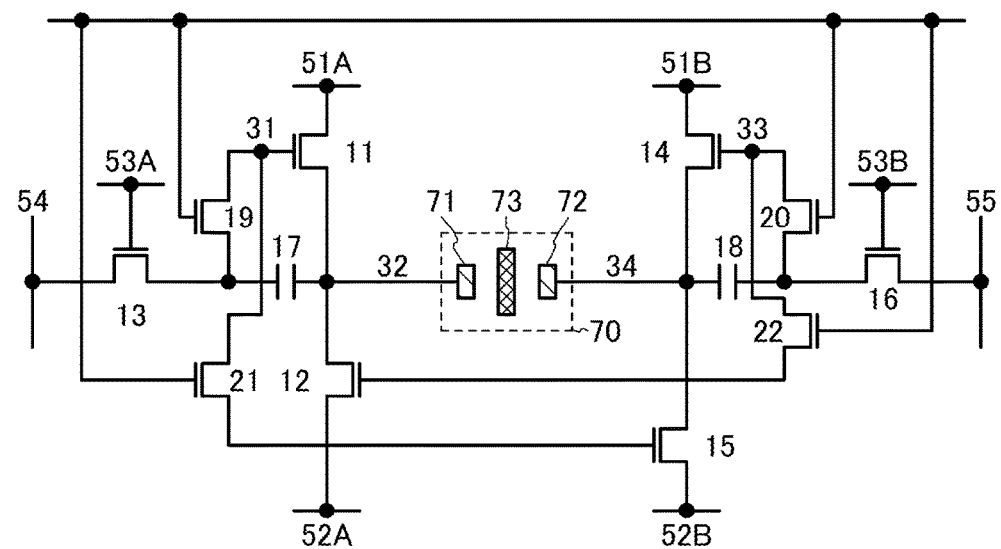
FIGS. 21A and 21B each illustrate an example of a semiconductor device.

In FIG. 1, the transistors 21 and 22 as well as the transistors 19 and 20 can be provided. As illustrated in FIG. 19B, the second terminal of the transistor 21 can be connected to the first terminal of the transistor 19, and the second terminal of the transistor 22 can be connected to the first terminal of the transistor 20. Alternatively, as illustrated in FIG. 20A, the second terminal of the transistor 21 can be connected to the second terminal of the transistor 19, and the second terminal of the transistor 22 can be connected to the second terminal of the transistor 20. Furthermore, as illustrated in FIG. 20B, the wirings 51A to 51F can be integrated into the wiring 51. Alternatively, as illustrated in FIG. 21A, the wirings 51C to 51F can be one wiring. The potential of the one wiring can be set at VDD or a value that is lower than VDD and higher than VSS.

Figure 21B:
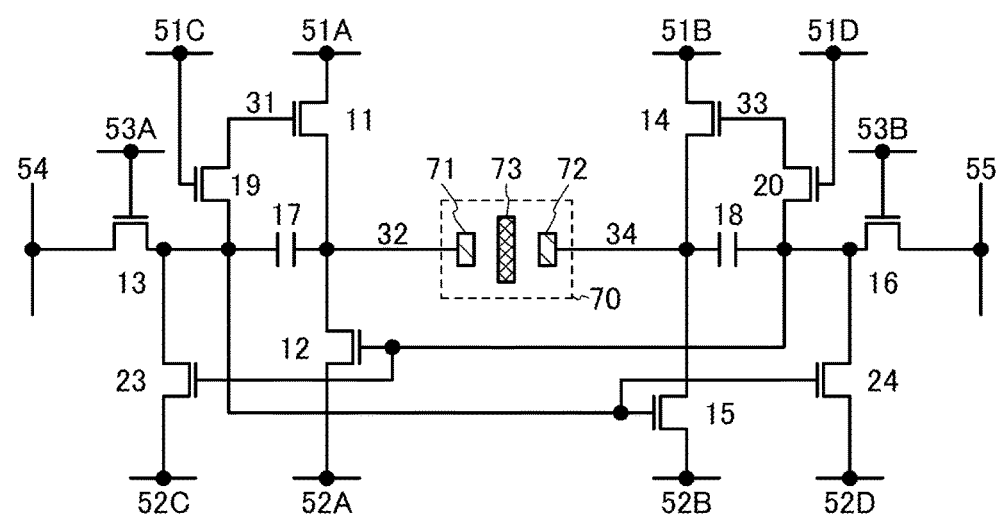
Figure 22A:
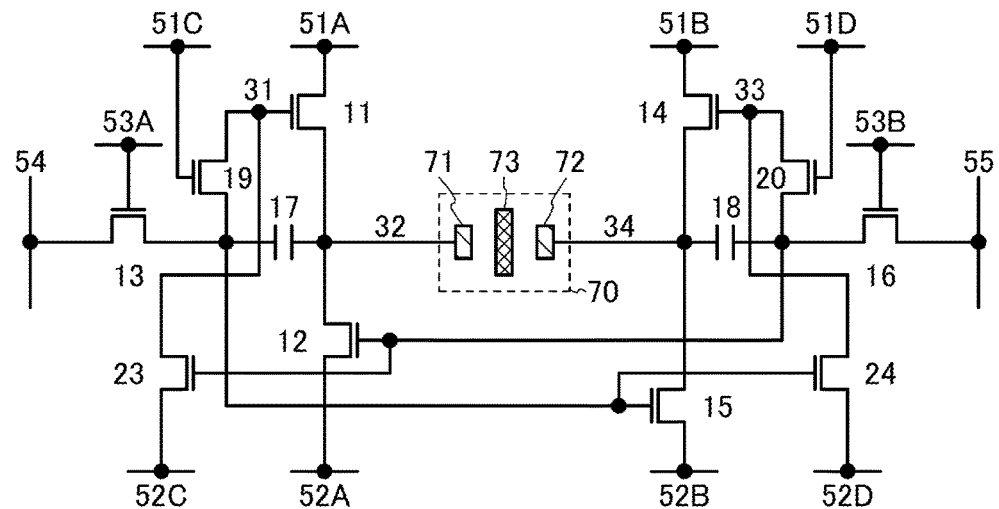
FIGS. 22A and 22B each illustrate an example of a semiconductor device.
Figure 22B:
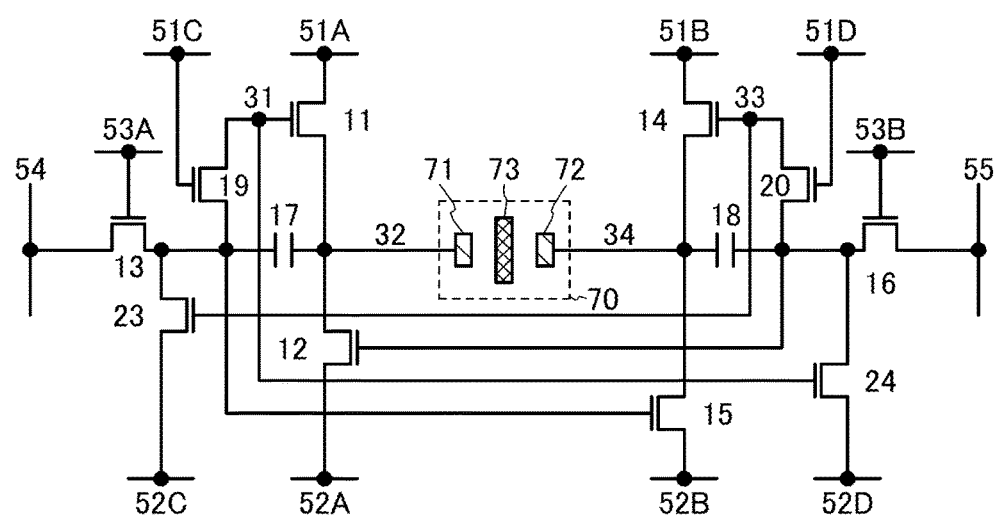

In FIG. 1, the transistors 23 and 24 as well as the transistors 19 and 20 can be provided. As illustrated in FIG. 21B, the second terminal of the transistor 23 can be connected to the second terminal of the transistor 19, and the second terminal of the transistor 24 can be connected to the second terminal of the transistor 20. Alternatively, as illustrated in FIG. 22A, the second terminal of the transistor 23 can be connected to the first terminal of the transistor 19, and the second terminal of the transistor 24 can be connected to the first terminal of the transistor 20. In addition, as illustrated in FIG. 21B, the gate of the transistor 23 can be connected to the second terminal of the transistor 20, and the gate of the transistor 24 can be connected to the second terminal of the transistor 19. Alternatively, as illustrated in FIG. 22B, the gate of the transistor 23 can be connected to the first terminal of the transistor 20, and the gate of the transistor 24 can be connected to the first terminal of the transistor 19.

Figure 23A:
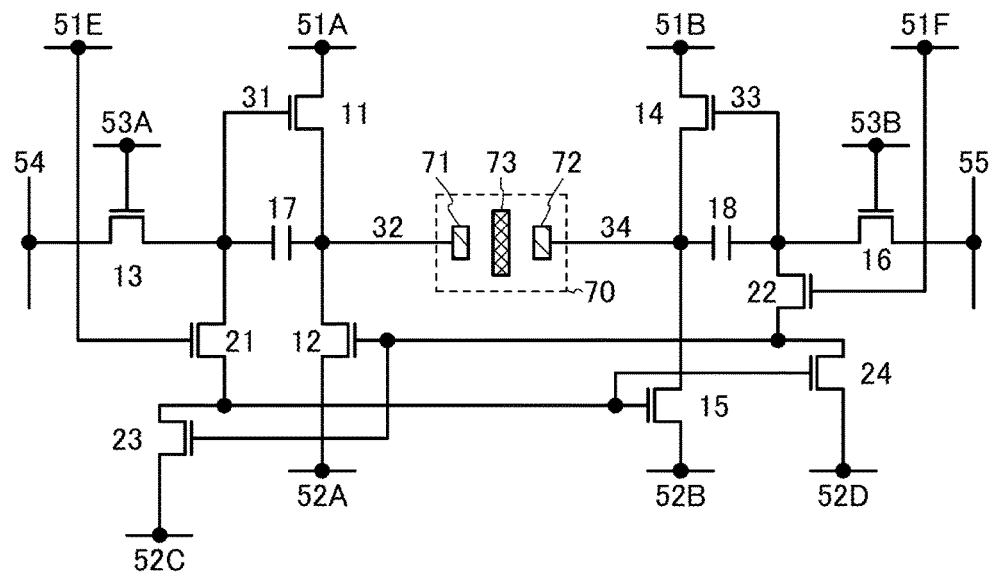
FIGS. 23A and 23B each illustrate an example of a semiconductor device.
Figure 23B:
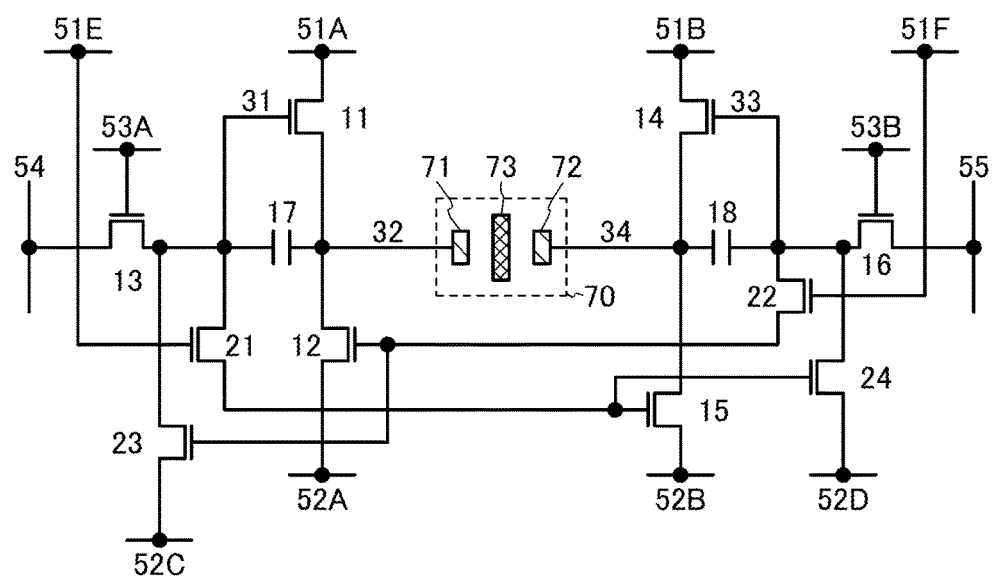
Figure 24A:
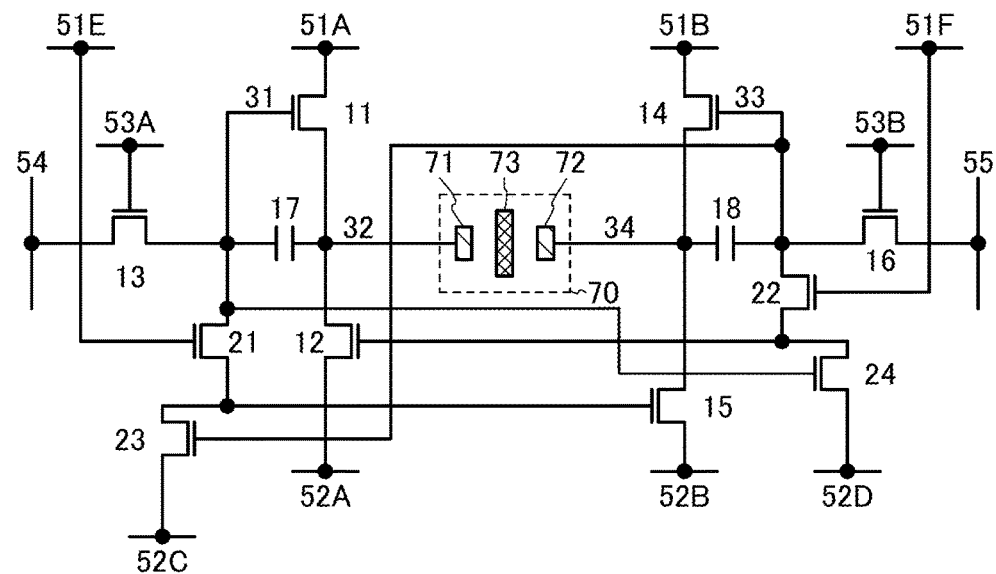
FIGS. 24A and 24B each illustrate an example of a semiconductor device.

In FIG. 1, the transistors 23 and 24 as well as the transistors 21 and 22 can be provided. As illustrated in FIG. 23A, the second terminal of the transistor 23 can be connected to the first terminal of the transistor 21, and the second terminal of the transistor 24 can be connected to the first terminal of the transistor 22. Alternatively, as illustrated in FIG. 23B, the second terminal of the transistor 23 can be connected to the second terminal of the transistor 21, and the second terminal of the transistor 24 can be connected to the second terminal of the transistor 22. In addition, as illustrated in FIG. 23A, the gate of the transistor 23 may be connected to the first terminal of the transistor 22, and the gate of the transistor 24 may be connected to the first terminal of the transistor 21. Alternatively, as illustrated in FIG. 24A, the gate of the transistor 23 may be connected to the second terminal of the transistor 22, and the gate of the transistor 24 may be connected to the second terminal of the transistor 21.

Figure 24B:
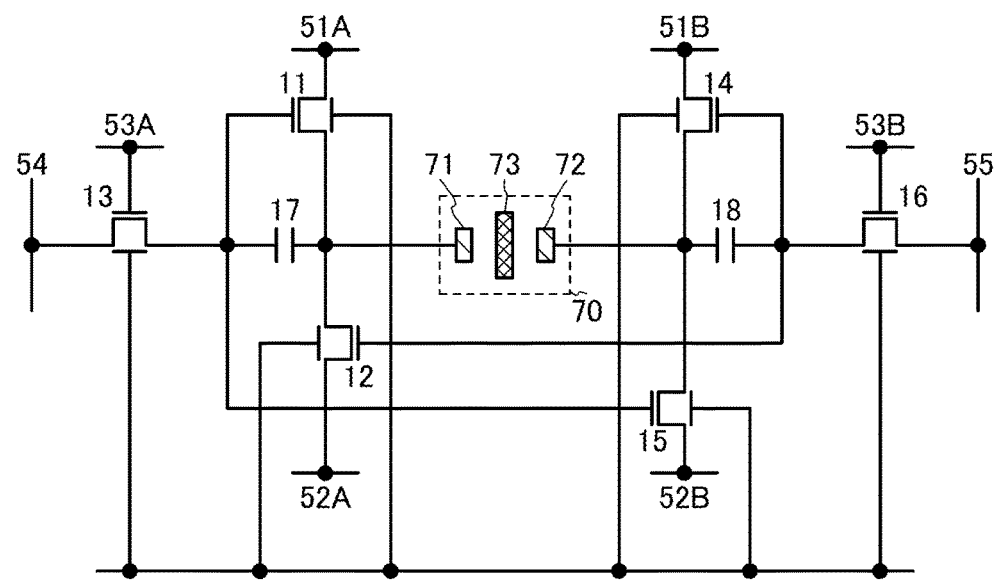

Note that in the semiconductor device 10 of one embodiment of the present invention, the transistor may have a backgate. That is, the transistor may include a first gate electrode, a second gate electrode, and a semiconductor layer (including a channel formation region) sandwiched between the first gate electrode and the second gate electrode. The first gate electrode may be connected to the second gate electrode. Alternatively, second gate electrodes of transistors may be connected to a common wiring. FIG. 24B illustrates an example of a configuration in which the second gate electrodes of the transistors 11 to 16 in FIG. 1 are connected to one wiring.

The description is made on a display device of one embodiment of the present invention; in the display device, the semiconductor device 10 of one embodiment of the present invention is used as a pixel.

Figure 25:
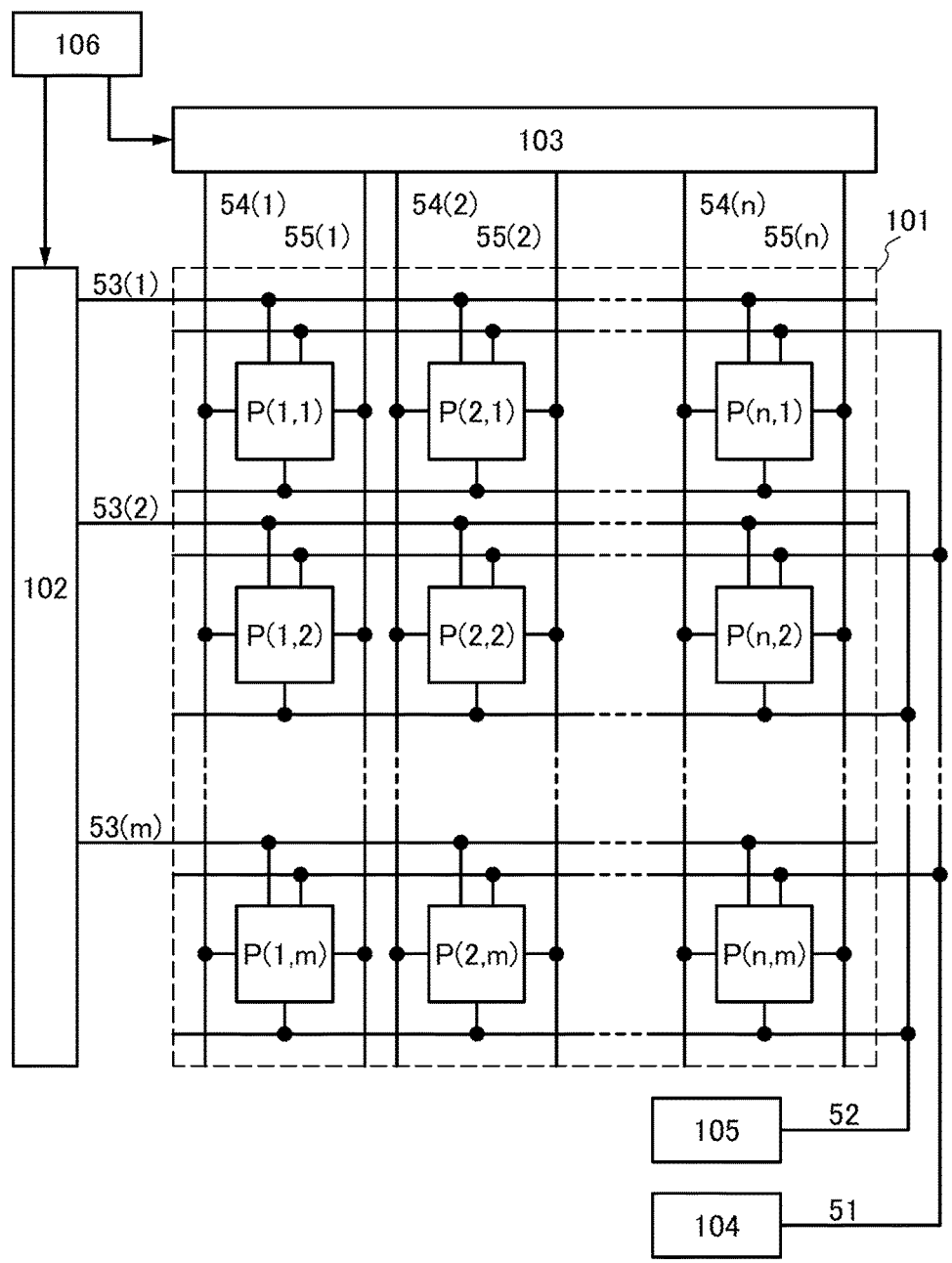
FIG. 25 illustrates an example of a display device.

FIG. 25 is a block diagram illustrating a display device 100 of one embodiment of the present invention. The display device 100 illustrated in FIG. 25 includes a pixel portion 101 and circuits 102 to 106. The pixel portion 101 is provided with the wiring 51, the wiring 52, wirings 53(1) to 53(m), wirings 54(1) to 54(n), and wirings 55(1) to 55(n), where m and n are each a natural number. The pixel portion 101 includes pixels P(1, 1) to P(n, m). The pixels P(1, 1) to P(n, m) are arranged in a matrix to correspond to the wirings 53(1) to 53(m), the wirings 54(1) to 54(n), and the wirings 55(1) to 55(n).

Figure 26:
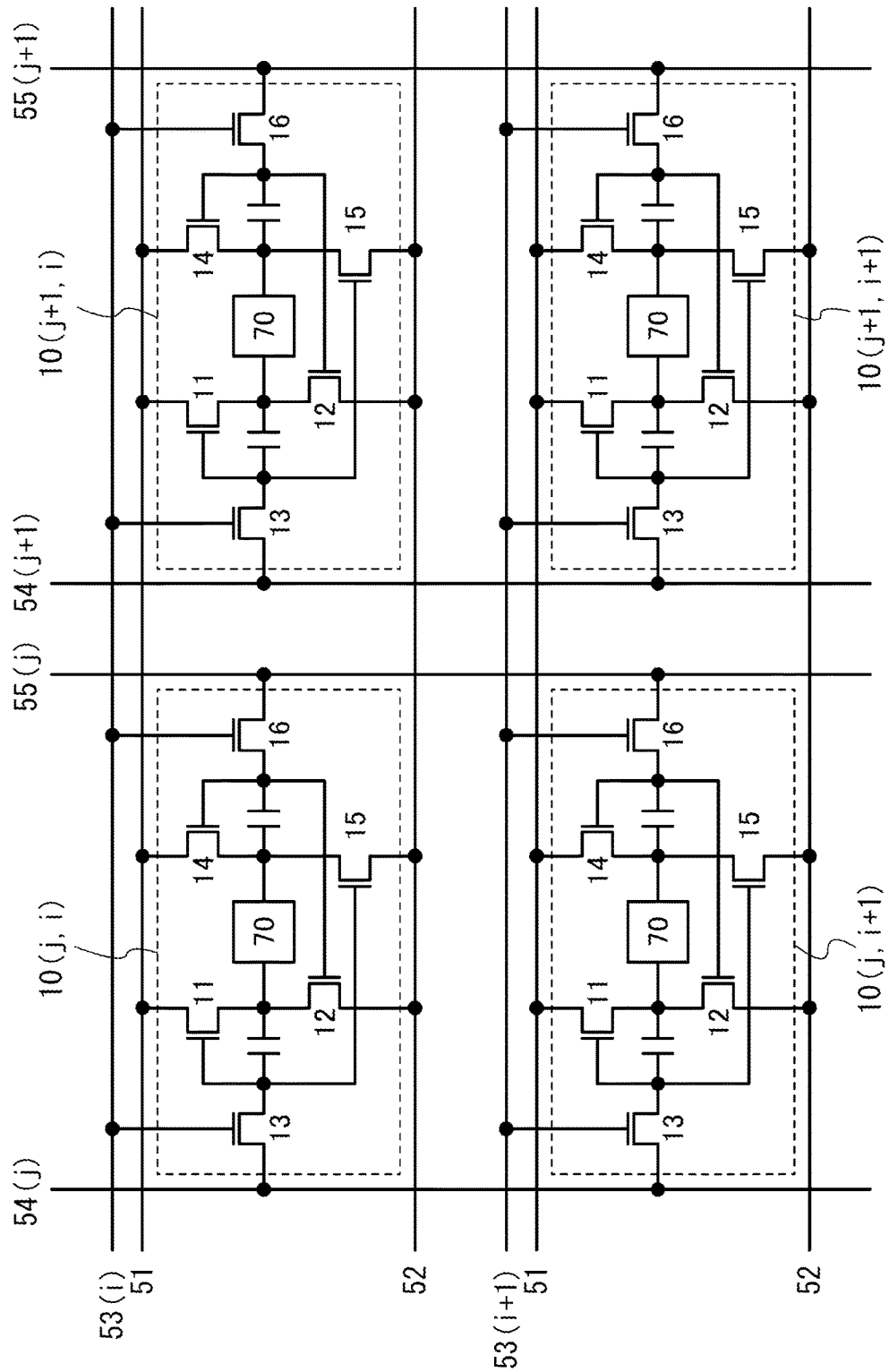
FIG. 26 illustrates an example of a display device.

The semiconductor device 10 of one embodiment of the present invention can be used as the pixels P(1, 1) to P(n, m). FIG. 26 illustrates a specific example of the pixel P(j, i) (j is one of 1 to n and i is one of 1 to m), the pixel P(j+1, i), the pixel P(j, i+1), and the pixel P(j+1, i+1). In FIG. 26, the semiconductor device 10 illustrated in FIG. 19A, in which the wirings 51A and 51B are integrated into the wiring 51, the wirings 52A and 52B are integrated into the wiring 52, and the wirings 53A and 53B are integrated into the wiring 53 in the semiconductor device 10 of FIG. 1, is used as the pixel P.

The circuit 102 is connected to the wirings 53(1) to 53(m). The circuit 102 controls the potentials of the wirings 53(1) to 53(m) independently by outputting signals to the wirings 53(1) to 53(m). Specifically, the circuit 102 selects the pixels P(1, 1) to P(n, m) row by row by sequentially setting the potentials of the wirings 53(1) to 53(m) high. In such a manner, the circuit 102 has a function of a driver circuit such as a scan line driver circuit or a gate driver. The wirings 53(1) to 53(m) have a function of a signal line such as a scan line or a gate signal line. Signals that are output from the circuit 102 to the wirings 53(1) to 53(m) correspond to gate signals, scan signals, or selection signals.

The circuit 103 is connected to the wirings 54(1) to 54(n) and the wirings 55(1) to 55(n). The circuit 103 controls the potentials of the wirings 54(1) to 54(n) independently by outputting signals to the wirings 54(1) to 54(n). Moreover, circuit 103 controls the potentials of the wirings 55(1) to 55(n) independently by outputting signals to the wirings 55(1) to 55(n). Specifically, the circuit 103 controls the potentials of the wirings 54(1) to 54(n) and the wirings 55(1) to 55(n) every time one of the wirings 53(1) to 53(m) is selected. In such a manner, the circuit 103 has a function of a driver circuit such as a signal line driver circuit or a source driver. The wirings 54(1) to 54(n) and the wirings 55(1) to 55(n) have a function of a signal line such as a video signal line or a source signal line. Signals that are output from the circuit 103 to the wirings 54(1) to 54(n) correspond to video signals.

The circuit 104 is connected to the wiring 51. The circuit 104 controls the potential of the wiring 51 by outputting a voltage to the wiring 51. In this manner, the circuit 104 has a function of a power supply circuit.

The circuit 105 is connected to the wiring 52. The circuit 105 controls the potential of the wiring 52 by outputting a voltage to the wiring 52. In this manner, the circuit 105 has a function of a power supply circuit.

The circuit 106 is connected to the circuit 102 and the circuit 103. The circuit 106 outputs a signal to the circuit 102 to control the circuit 102. Moreover, the circuit 106 outputs a signal to the circuit 103 to control the circuit 103. In such a manner, the circuit 106 has a function of a timing controller.

Figure 27:
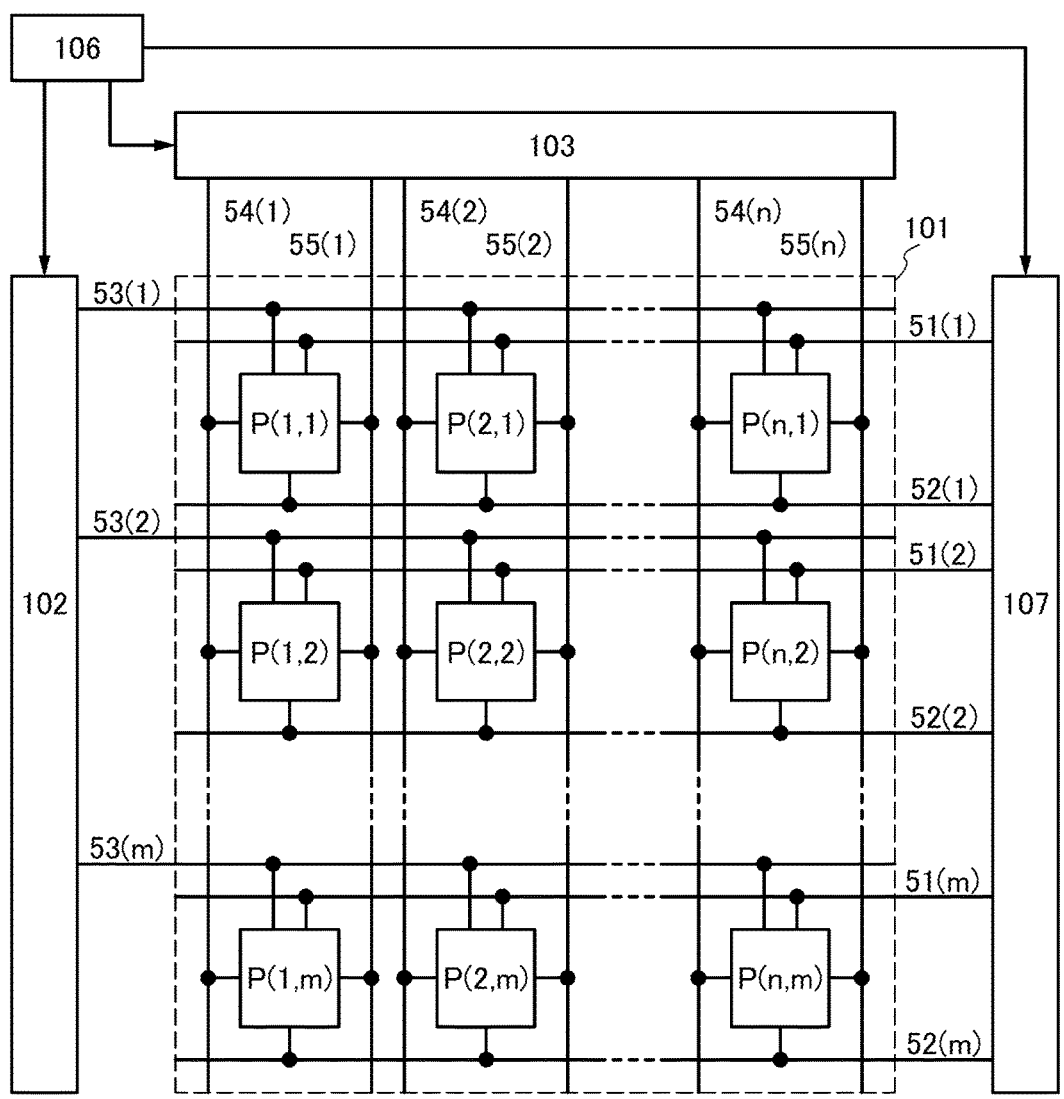
FIG. 27 illustrates an example of a display device.

As illustrated in FIG. 27, the wiring 51 and the wiring 52 may be provided for each row. In FIG. 27, wirings 51(1) to 51(m) and wirings 52(1) to 52(m) are provided in the pixel portion 101. The display device 100 also includes a circuit 107. The circuit 107 is connected to the wirings 51(1) to 51(m) and the wirings 52(1) to 52(m). The circuit 107 controls the potentials of the wirings 51(1) to 51(m) independently by outputting signals to the wirings 51(1) to 51(m). Furthermore, the circuit 107 controls the potentials of the wirings 52(1) to 52(m) independently by outputting signals to the wirings 52(1) to 52(m).

The pixel P can express multiple gray levels using a time grayscale method or an area grayscale method.

In a time grayscale method, one frame period has N subframe periods (N is a natural number of 2 or more). Each of the N subframe periods has the periods Ta and Tb. Accordingly, the MEMS device 70 can be controlled in each of the N subframe periods, whereby multiple gray levels can be expressed.

Note that at least two of the N subframe periods preferably have different lengths. More preferably, the periods Tb in at least two of the N subframe periods have different lengths. In this case, the periods Ta preferably have the same length.

Figure 28A:
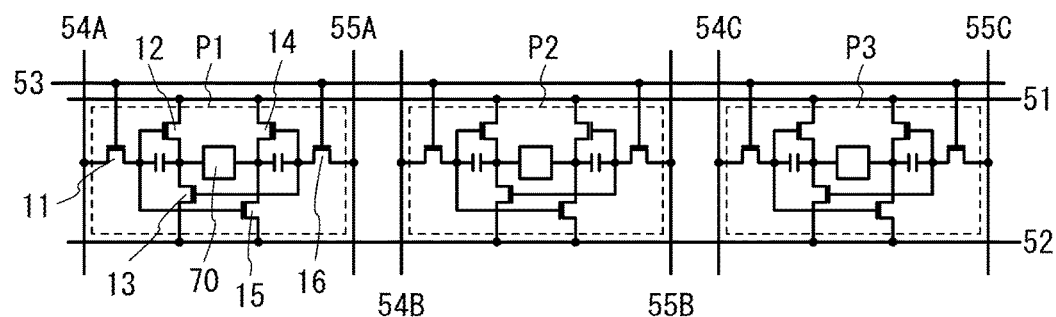
FIGS. 28A and 28B each illustrate an example of a display device.
Figure 28B:
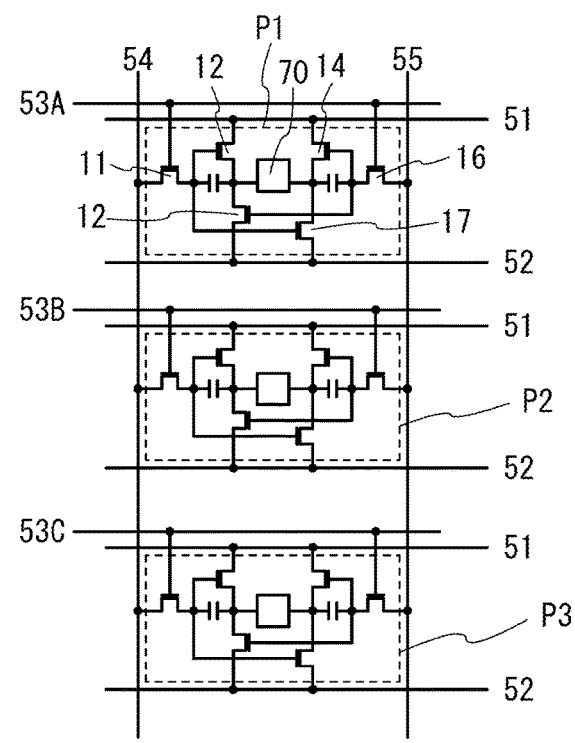

In the case of using an area grayscale method, the pixel P includes N subpixels. The MEMS device 70 is controlled in each of the N subpixels, whereby multiple gray levels can be expressed. In FIGS. 28A and 28B, the pixel P includes subpixels P1 to P3. In the subpixels P1 to P3 of FIG. 28A, the wiring 54 is divided into three wirings 54A to 54C, the wiring 55 is divided into three wirings 55A to 55C, and the wiring 53 is common. In the subpixels P1 to P3 of FIG. 28B, the wiring 53 is divided into three wirings 53A to 53C, the wiring 54 is common, and the wiring 55 is common.

The pixel P can perform color display using a color sequential method or a color filter method.

In a color sequential method, one frame period has N periods. Each of the N periods has the periods Ta and Tb. The color of a backlight varies between the N periods. Accordingly, the MEMS device 70 can be controlled and the color of the backlight is different in each of the N periods, so that color display is achieved.

In the case of using a color filter method, color display is achieved by providing a color filter to overlap the MEMS device 70.

A preferred embodiment of the semiconductor device 10 or the display device 100 according to one embodiment of the present invention will be described.

In the semiconductor device 10 of one embodiment of the present invention, the bootstrap operation allows the potentials of the nodes 31 and 33 to be higher than VDD. For this reason, it is preferred that the amplitude voltage of the wiring 54 be smaller than the potential difference between the first terminal of the transistor 11 and the first terminal of the transistor 12, and that the amplitude voltage of the wiring 55 be smaller than the potential difference between the first terminal of the transistor 14 and the first terminal of the transistor 15. Alternatively it is preferred that the high potential of the wiring 54 be lower than the potential of the first terminal of the transistor 11, and that the high potential of the wiring 55 be lower than the potential of the first terminal of the transistor 14. Consequently, power consumption can be reduced.

It is preferred that the ratio of channel width to channel length (W/L ratio) of the transistor 11 be substantially equal to that of the transistor 14. It is preferred that the W/L ratio of the transistor 12 be substantially equal to that of the transistor 15. It is preferred that the W/L ratio of the transistor 13 be substantially equal to that of the transistor 16. It is preferred that the W/L ratio of the transistor 19 be substantially equal to that of the transistor 20. It is preferred that the W/L ratio of the transistor 21 be substantially equal to that of the transistor 22. It is preferred that the W/L ratio of the transistor 23 be substantially equal to that of the transistor 24. It is preferred that the area where the first electrode and the second electrode of the capacitor 17 overlap be substantially equal to the area where the first electrode and the second electrode of the capacitor 18 overlap.

Note that the expression "A is substantially equal to B" means that A ranges from 70% to 130%, preferably from 80% to 120%, more preferably from 90% to 110% of B.

When the volume of the component 71 is larger than that of the component 72, the W/L ratio of the transistor 11 is preferably higher than that of the transistor 14. The W/L ratio of the transistor 12 is preferably higher than that of the transistor 15. The W/L ratio of the transistor 13 is preferably higher than that of the transistor 16. The W/L ratio of the transistor 19 is preferably higher than that of the transistor 20. The W/L ratio of the transistor 21 is preferably higher than that of the transistor 22. The W/L ratio of the transistor 23 is preferably higher than that of the transistor 24. The area where the first electrode and the second electrode of the capacitor 17 overlap is preferably larger than the area where the first electrode and the second electrode of the capacitor 18 overlap.

The transistors 11, 12, 14, and 15 preferably have a high W/L ratio to drive the MEMS device 70. That is, the W/L ratio of each of the transistors 11, 12, 14, and 15 is preferably higher than that of each of the transistors 13, 16, 19, 20, 21, 22, 23, and 24.

A gate-source voltage of each of the transistors 11 and 14 is sometimes lower than that of each of the transistors 12 and 15. In view of this, the W/L ratio of each of the transistors 11 and 14 is preferably higher than that of each of the transistors 12 and 15.

The W/L ratio of each of the transistors 13 and 16 is preferably lower than that of each of the transistors 11, 12, 14, 15, 19, 20, 21, 22, 23, and 24.

This embodiment can be combined with any other embodiment as appropriate. Note that a content (or part thereof) described in one embodiment can be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

(Embodiment 2)

In this embodiment, the structure of the semiconductor device 10 described in Embodiment 1 will be explained.

Figure 29:
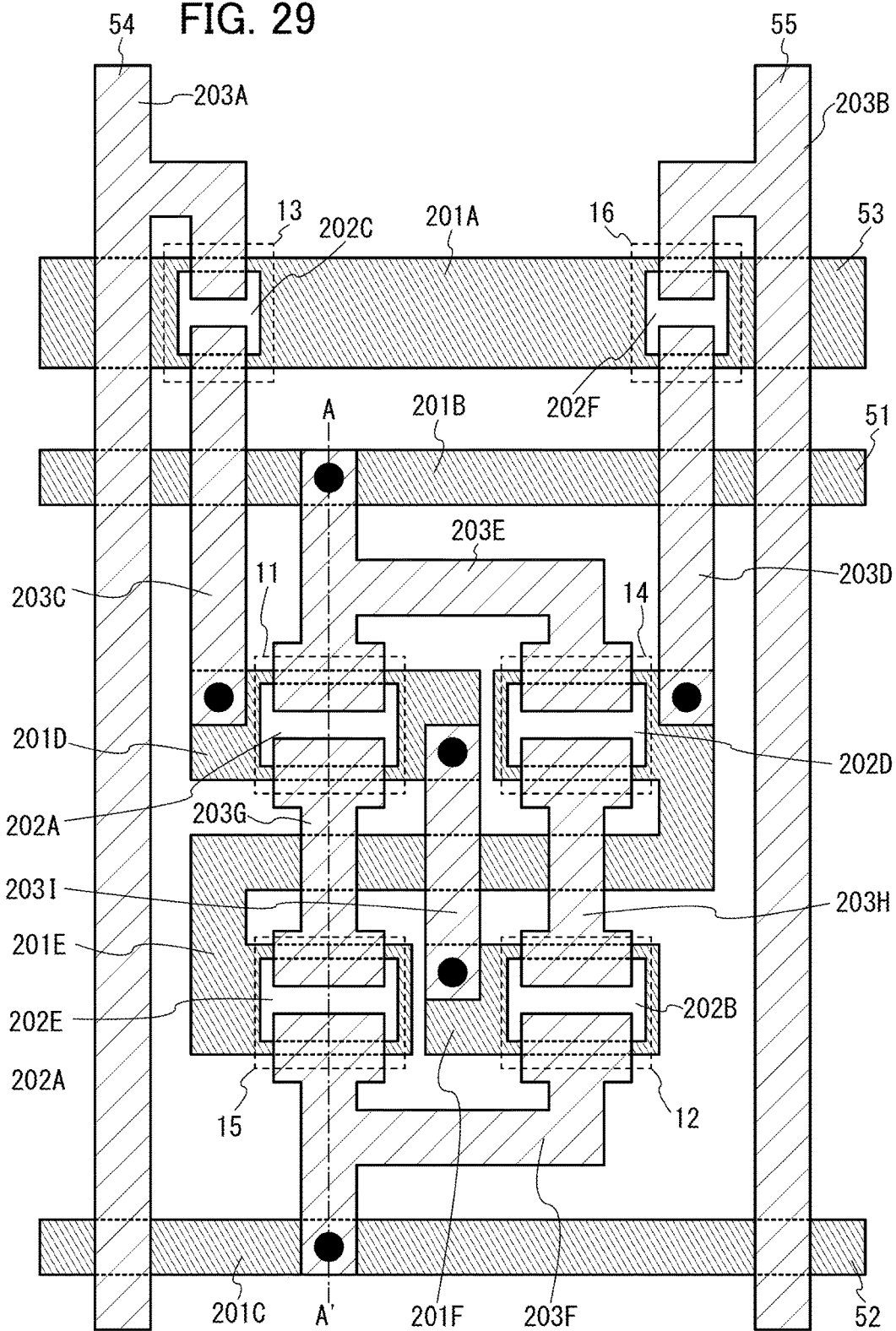
FIG. 29 illustrates an example of a semiconductor device.
Figure 30:
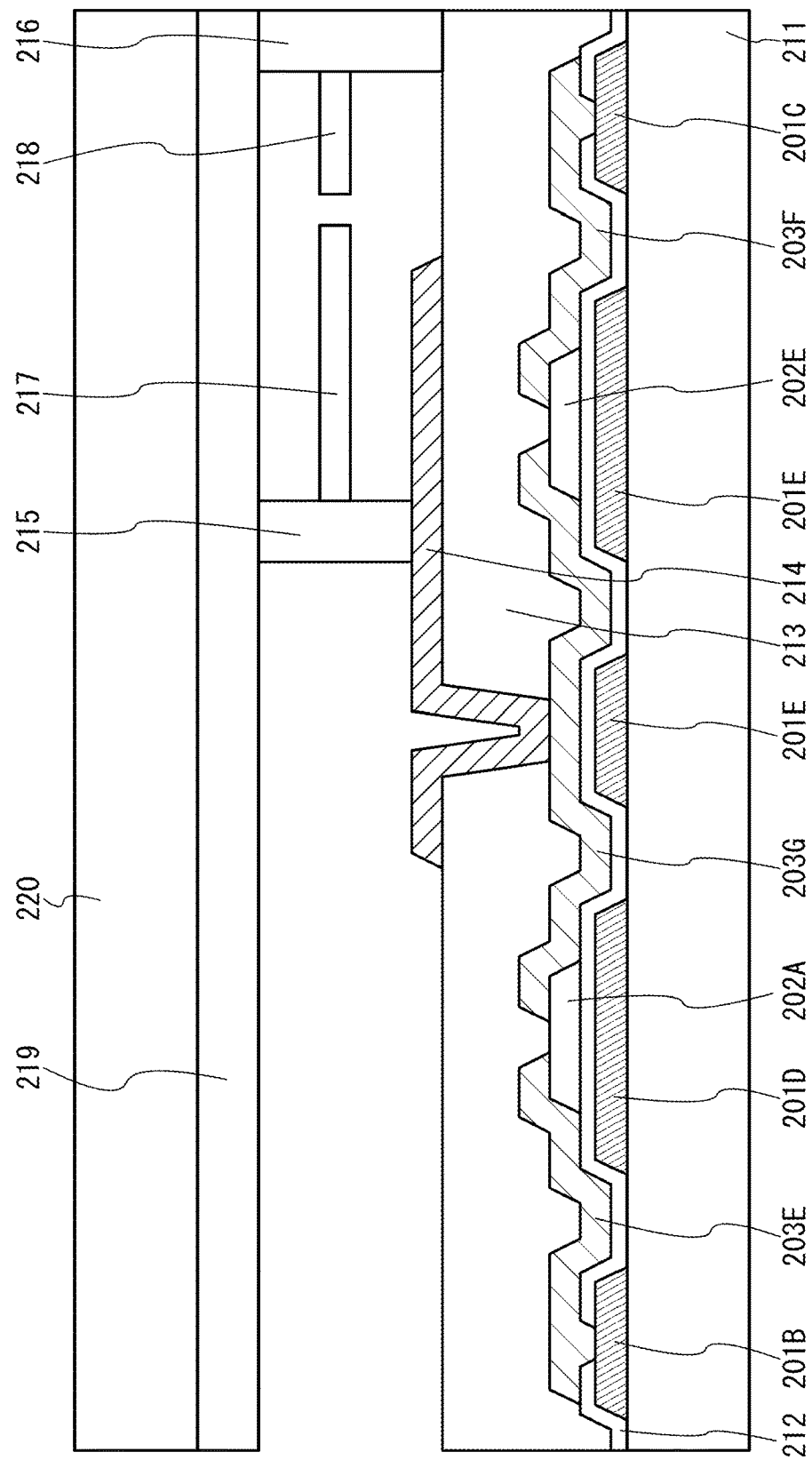
FIG. 30 illustrates an example of a semiconductor device.

FIG. 29 is a top view of the semiconductor device 10 illustrated in FIG. 1. FIG. 30 shows a cross section along the line A-A' in FIG. 29. With this structure, the transistors can be arranged efficiently. Moreover, the number of contact holes can be decreased, resulting in higher yield.

Conductive layers 201A to 201E are placed above a substrate 211. An insulating layer 212 is placed above the conductive layers 201A to 201E. Semiconductor layers 202A to 202F are placed above the insulating layer 212. Conductive layers 203A to 203I are placed above the insulating layer 212 and the semiconductor layers 202A to 202F. An insulating layer 213 is placed above the conductive layers 203A to 203I. A conductive layer 214 is placed above the insulating layer 213. A structure body 215 is placed above the conductive layer 214, and a structure body 216 is placed above the insulating layer 213. An electrode 217 is fixed to the structure body 215. An electrode 218 is fixed to the structure body 216. A drying agent 219 is placed above the structure bodies 215 and 216. A substrate 220 is placed above the drying agent 219.

The conductive layers 201A to 201E contain the same material. Alternatively, the conductive layers 201A to 201E are formed through a step of processing one conductive layer. The conductive layers 201A to 201E are formed as different islands. The conductive layer 201A has a region functioning as the wiring 53, a region functioning as the gate electrode of the transistor 13, and a region functioning as the gate electrode of the transistor 16. The conductive layer 201B has a region functioning as the wiring 51. The conductive layer 201C has a region functioning as the wiring 52. The conductive layer 201D has a region functioning as the gate electrode of the transistor 11. The conductive layer 201E has a region functioning as the gate electrode of the transistor 14 and a region functioning as the gate electrode of the transistor 15. The conductive layer 201F has a region functioning as the gate electrode of the transistor 12.

The insulating layer 212 has a region functioning as a gate insulating film of the transistor 11, a region functioning as a gate insulating film of the transistor 12, a region functioning as a gate insulating film of the transistor 13, a region functioning as a gate insulating film of the transistor 14, a region functioning as a gate insulating film of the transistor 15, and a region functioning as a gate insulating film of the transistor 16.

The semiconductor layers 202A to 202F contain the same material. Alternatively, the semiconductor layers 202A to 202F are formed through a step of processing one semiconductor layer. The semiconductor layers 202A to 202F are formed as different islands. The semiconductor layer 202A has a channel formation region of the transistor 11. The semiconductor layer 202B has a channel formation region of the transistor 12. The semiconductor layer 202C has a channel formation region of the transistor 13. The semiconductor layer 202D has a channel formation region of the transistor 14. The semiconductor layer 202E has a channel formation region of the transistor 15. The semiconductor layer 202F has a channel formation region of the transistor 16.

The conductive layers 203A to 203I contain the same material. Alternatively, the conductive layers 203A to 203I are formed through a step of processing one conductive layer. The conductive layers 203A to 203I are formed as different islands. The conductive layer 203A has a region functioning as the wiring 54 and a region functioning as one of the source electrode and the drain electrode of the transistor 13. The conductive layer 203B has a region functioning as the wiring 55 and a region functioning as one of the source electrode and the drain electrode of the transistor 16. The conductive layer 203C has a region functioning as the other of the source electrode and the drain electrode of the transistor 13. The conductive layer 203C is electrically connected to the conductive layer 201D through a contact hole in the insulating layer 212. The conductive layer 203D has a region functioning as the other of the source electrode and the drain electrode of the transistor 16. The conductive layer 203D is electrically connected to the conductive layer 201E through a contact hole in the insulating layer 212. The conductive layer 203E has a region functioning as one of the source electrode and the drain electrode of the transistor 11 and a region functioning as one of the source electrode and the drain electrode of the transistor 14. The conductive layer 203E is electrically connected to the conductive layer 201B through a contact hole in the insulating layer 212. The conductive layer 203F has a region functioning as one of the source electrode and the drain electrode of the transistor 12 and a region functioning as one of the source electrode and the drain electrode of the transistor 15. The conductive layer 203F is electrically connected to the conductive layer 201C through a contact hole in the insulating layer 212. The conductive layer 203G has a region functioning as the other of the source electrode and the drain electrode of the transistor 11 and a region functioning as the other of the source electrode and the drain electrode of the transistor 15. The conductive layer 203H has a region functioning as the other of the source electrode and the drain electrode of the transistor 12 and a region functioning as the other of the source electrode and the drain electrode of the transistor 14. The conductive layer 203I is electrically connected to the conductive layer 201D through a contact hole in the insulating layer 212 and electrically connected to the conductive layer 201F through another contact hole in the insulating layer 212.

The conductive layer 214 is electrically connected to the conductive layer 203G through a contact hole in the insulating layer 213. The electrode 217 is electrically connected to the conductive layer 214.

The conductive layers 201A to 201E can be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these elements; or the like.

The conductive layers 201A to 201E may have a single-layer structure or a stacked-layer structure of two or more layers. For example, it is possible to employ a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, or a three-layer structure in which a titanium film, an aluminum film, and a titanium film are stacked in this order. Alternatively, an alloy film or a nitride film that contains aluminum and one or more elements selected from titanium, tantalum, tungsten, molybdenum, chromium, neodymium, and scandium may be used.

The conductive layers 201A to 201E can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive layers 201A to 201E. The use of a Cu—X alloy film results in lower fabrication costs because the film can be processed by wet etching.

For the semiconductor layers 202A to 202F, a single crystal semiconductor or a non-single-crystal semiconductor can be used. Examples of a non-single-crystal semiconductor include non-single-crystal silicon and non-single-crystal germanium. Examples of non-single-crystal silicon include amorphous silicon, microcrystalline silicon, and polycrystalline silicon. Examples of non-single-crystal germanium include amorphous germanium, microcrystalline germanium, and polycrystalline germanium.

An oxide semiconductor film is preferably used as the semiconductor layers 202A to 202F. The oxide semiconductor film can be formed by using In-M oxide (M is Ti, Ga, Sn, Y, Zr, La, Ce, Nd, or Hf) or In-M-Zn oxide. It is particularly preferable to use In-M-Zn oxide for the oxide semiconductor film. When the oxide semiconductor film is an In-M-Zn oxide film, it is preferred that the atomic ratio of the metal elements of a sputtering target used for forming the In-M-Zn oxide film satisfy In≥M and Zn≥M. As the atomic ratio of the metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. When the oxide semiconductor film is an In-M-Zn oxide film, a target including polycrystalline In-M-Zn oxide is preferably used as a sputtering target. With the use of the target including polycrystalline In-M-Zn oxide, an oxide semiconductor film having crystallinity can be easily formed. Note that the atomic ratio of metal elements in the oxide semiconductor film may vary from the atomic ratio of those in the above sputtering target, within a range of ±40% as an error. For example, when a sputtering target with an atomic ratio of In:Ga:Zn=4:2:4.1 is used, the atomic ratio of In to Ga and Zn in the oxide semiconductor film may be 4:2:3 or in the vicinity of 4:2:3.

The energy gap of the oxide semiconductor film is 2 eV or more, preferably 2.5 eV or more, further preferably 3 eV or more. The off-state current of a transistor can be reduced by using an oxide semiconductor having a wide energy gap.

The thickness of the oxide semiconductor film ranges from 3 nm to 200 nm, preferably from 3 nm to 100 nm, further preferably from 3 nm to 50 nm.

An oxide semiconductor film with low carrier density is used as the oxide semiconductor film. For example, the carrier density of the oxide semiconductor film is lower than or equal to $1\times10^{17}$/cm$^3$, preferably lower than or equal to $110^{15}$/cm$^3$, further preferably lower than or equal to $1\times10^{13}$/cm$^3$, still further preferably lower than or equal to $1\times10^{11}$/cm$^3$. The carrier density of the oxide semiconductor film may be preferably greater than or equal to $1\times10^{5}$/cm$^3$, further preferably greater than or equal to $1\times10^{7}$/cm$^3$.

Note that the composition is not limited to the above, and it is possible to use an oxide semiconductor film with an appropriate composition depending on required semiconductor characteristics and electrical characteristics (e.g., field-effect mobility and threshold voltage) of a transistor. To obtain the required semiconductor characteristics of the transistor, it is preferred that the carrier density, the impurity concentration, the defect density, the atomic ratio of a metal element to oxygen, the interatomic distance, the density, and the like of the oxide semiconductor film be set to appropriate values.

The oxide semiconductor film is preferably an oxide semiconductor film where the impurity concentration is low and the density of defect states is low, in which case the transistors can have quite excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film exhibits an extremely low off-state current. The off-state current of an element having a channel width W of $1\times10^{6}$ μm and a channel length L of 10 μm can be less than or equal to the measurement limit of a semiconductor parameter analyzer, i.e., less than or equal to $1\times10^{-13}$ A at a voltage between a source electrode and a drain electrode (drain voltage) of 1 V to 10V.

Accordingly, the transistor in which the channel region is formed in the highly purified intrinsic or substantially highly purified intrinsic oxide semiconductor film can have a small variation in electrical characteristics and high reliability. Charge trapped by the trap states in the oxide semiconductor film takes a long time to be released and may behave like fixed charge. Thus, a transistor whose channel region is formed in an oxide semiconductor film having a high density of trap states has unstable electrical characteristics in some cases. Examples of impurities are hydrogen, nitrogen, alkali metal, and alkaline earth metal.

Hydrogen contained in the oxide semiconductor film reacts with oxygen bonded to a metal atom to form water, and also causes oxygen vacancies in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferred that hydrogen be reduced as much as possible in the oxide semiconductor film. Specifically, in the oxide semiconductor film, the hydrogen concentration measured by secondary mass spectrometry (SIMS) may be $2\times10^{20}$ atoms/cm$^3$ or lower, preferably $5\times10^{19}$ atoms/cm$^3$ or lower, further preferably $1\times10^{19}$ atoms/cm$^3$ or lower, further preferably $5\times10^{18}$ atoms/cm$^3$ or lower, still further preferably $1\times10^{18}$ atoms/cm$^3$ or lower, yet still further preferably $5\times10^{17}$ atoms/cm$^3$ or lower. Moreover, in the oxide semiconductor film, the hydrogen concentration measured by SIMS may be $1\times10^{16}$ atoms/cm$^3$ or higher, preferably $1\times10^{17}$ atoms/cm$^3$ or higher.

If silicon or carbon, which is an element belonging to Group 14, is contained in the oxide semiconductor film, oxygen vacancies are increased in the oxide semiconductor film, and the oxide semiconductor film becomes an n-type film. Thus, the concentration of silicon or carbon in the oxide semiconductor film and the concentration of silicon or carbon at or near an interface with the oxide semiconductor film (concentration measured by SIMS) is lower than or equal to $2\times10^{18}$ atoms/cm$^3$. The concentration of silicon or carbon in the oxide semiconductor film or the concentration of silicon or carbon at or near an interface with the oxide semiconductor film (concentration measured by SIMS) may be higher than or equal to $1 \times 10^{17}$ atoms/cm$^3$, preferably higher than or equal to $3 \times 10^{17}$ atoms/cm$^3$, further preferably higher than or equal to $1 \times 10^{18}$ atoms/cm$^3$.

The concentration of alkali metal or alkaline earth metal of the oxide semiconductor film, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film. In addition, the concentration of alkali metal or alkaline earth metal of the oxide semiconductor film, which is measured by SIMS, may be higher than or equal to $5 \times 10^{15}$ atoms/cm$^3$, preferably higher than or equal to $1 \times 10^{16}$ atoms/cm$^3$.

If nitrogen is contained in the oxide semiconductor film, electrons serving as carriers are generated and the carrier density increases, so that the oxide semiconductor film easily becomes an n-type film. Thus, a transistor including an oxide semiconductor film that contains nitrogen is likely to have normally-on characteristics. For this reason, nitrogen in the oxide semiconductor film is preferably reduced as much as possible; the nitrogen concentration measured by SIMS is preferably lower than or equal to $5 \times 10^{18}$ atoms/cm$^3$, for example. Furthermore, the nitrogen concentration measured by SIMS may be higher than or equal to $1 \times 10^{16}$ atoms/cm$^3$, preferably higher than or equal to $5 \times 10^{16}$ atoms/cm$^3$, further preferably higher than or equal to $1 \times 10^{17}$ atoms/cm$^3$, still further preferably higher than or equal to $5 \times 10^{17}$ atoms/cm$^3$.

The oxide semiconductor film may have a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect levels, whereas CAAC-OS has the lowest density of defect levels.

A structure of the oxide semiconductor film is described below.

An oxide semiconductor film is classified into a non-single-crystal oxide semiconductor film and a single crystal oxide semiconductor film. Furthermore, an oxide semiconductor is classified into, for example, a crystalline oxide semiconductor and an amorphous oxide semiconductor.

Examples of a non-single-crystal oxide semiconductor include CAAC-OS, a polycrystalline oxide semiconductor, a microcrystalline oxide semiconductor, and an amorphous oxide semiconductor. Examples of a crystalline oxide semiconductor include a single crystal oxide semiconductor, CAAC-OS, a polycrystalline oxide semiconductor, and a microcrystalline oxide semiconductor.

First, a CAAC-OS film is described.

A CAAC-OS film is an oxide semiconductor film having a plurality of c-axis-aligned crystal parts.

With a transmission electron microscope (TEM), a plurality of crystal parts in a CAAC-OS film are observed in a combined analysis image (also referred to as a high-resolution TEM image) of a bright-field image and a diffraction pattern of the CAAC-OS film. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

When a CAAC-OS film, e.g., a CAAC-OS film including an InGaZnO$_4$ crystal, is subjected to structural analysis by an out-of-plane method with an X-ray diffraction (XRD) apparatus, a peak appears frequently at a diffraction angle (2θ) of around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in the CAAC-OS film. It is preferred that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. An element that has higher bonding strength to oxygen than a metal element included in the oxide semiconductor film, such as silicon, disturbs the atomic arrangement of the oxide semiconductor film by abstracting oxygen from the oxide semiconductor film and causes a decrease in crystallinity. A heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. The impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

With the use of the CAAC-OS film in a transistor, variation in the electrical characteristics of the transistor due to irradiation with visible light or ultraviolet light is small.

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film ranges from 1 nm to 100 nm or from 1 nm to 10 nm. A microcrystal with a size in the range of 1 nm to 10 nm or of 1 nm to 3 nm is specifically referred to as nanocrystal (nc). An oxide semiconductor film including nanocrystal is referred to as a nanocrystalline oxide semiconductor (nc-OS) film. For example, in a high-resolution TEM image of the nc-OS film, a grain boundary is not clearly observed in some cases.

In the nc-OS film, a microscopic region (e.g., a region with a size ranging from 1 nm to 10 nm, in particular, from 1 nm to 3 nm) has a periodic atomic order. There is no regularity of crystal orientation between different crystal parts in the nc-OS film; thus, the orientation of the whole film is not observed. Consequently, the nc-OS film cannot be distinguished from an amorphous oxide semiconductor film by some analysis methods. For example, when the nc-OS film is subjected to structural analysis by an out-of-plane method with an XRD apparatus using an X-ray having a diameter larger than the size of a crystal part, a peak showing a crystal plane does not appear. A diffraction pattern like a halo pattern appears in a selected-area electron diffraction pattern of the nc-OS film obtained by using an electron beam having a probe diameter larger than the size of a crystal part (e.g., having a probe diameter of 50 nm or larger). Meanwhile, in a nanobeam electron diffraction pattern of the nc-OS film obtained by using an electron beam having a probe diameter close to or smaller than the size of a crystal part, spots are observed. Moreover, in a nanobeam electron diffraction pattern of the nc-OS film, regions with high luminance in a circular (ring) pattern are shown or a plurality of spots are shown in a ring-like region in some cases.

The nc-OS film is an oxide semiconductor film that has higher regularity than an amorphous oxide semiconductor film, and therefore has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

An amorphous oxide semiconductor film has disordered atomic arrangement and no crystal part. An example of the amorphous oxide semiconductor film is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but any spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void is sometimes observed. Furthermore, in the high-resolution TEM image, there are a region where a crystal part is clearly observed and a region where a crystal part is not observed. In the a-like OS film, crystallization is induced by a weak electron beam used for TEM observation and the growth of the crystal part is found in some cases. In contrast, crystallization is scarcely observed in the nc-OS film having good quality when the electron-beam irradiation is carried out at a low intensity as in the TEM observation.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to be 0.29 nm from crystal structure analysis. Thus, when focusing on the lattice fringes in the high-resolution TEM image, each of the lattice fringes in which the spacing therebetween is from 0.28 nm to 0.30 nm corresponds to the a-b plane of the $InGaZnO_4$ crystal.

The density of an oxide semiconductor film varies with its structure in some cases. For example, when the composition of an oxide semiconductor film becomes clear, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in an oxide semiconductor film with an atomic ratio of In:Ga:Zn=1:1:1, the density of single crystal $InGaZnO_4$ with a rhombohedral crystal structure is 6.357 $g/cm^3$. Thus, for example, the density of an a-like OS film with an atomic ratio of In:Ga:Zn=1:1:1 is higher than or equal to 5.0 $g/cm^3$ and lower than 5.9 $g/cm^3$. Moreover, for example, the density of an nc-OS film or a CAAC-OS film with an atomic ratio of In:Ga:Zn=1:1:1 is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate a density that corresponds to the density of a single crystal with a desired composition. The density of the single crystal with a desired composition can be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

The conductive layers 203A to 203I can appropriately employ any of materials or structures that can be used for the conductive layers 201A to 201F.

The substrate 211 preferably has heat resistance high enough to withstand at least heat treatment performed later. For example, a glass substrate, a ceramic substrate, a quartz substrate, or a sapphire substrate may be used as the substrate 211. A single crystal semiconductor substrate or a polycrystalline semiconductor substrate made of silicon, silicon carbide, or the like, a compound semiconductor substrate made of silicon germanium or the like, an SOI substrate, or the like may be used as the substrate 211. Furthermore, any of these substrates provided with a semiconductor element may be used as the substrate 211. In the case where a glass substrate is used as the substrate 211, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm); thus, a large-sized display device can be manufactured.

A flexible substrate may be used as the substrate 211, and the transistor may be provided directly on the flexible substrate. Alternatively, a separation layer may be provided between a substrate and the transistor. The separation layer over which part or the whole of a semiconductor device is formed can be used to separate the semiconductor device from the substrate and transfer the semiconductor device to another substrate. In this case, the transistor can be transferred to a substrate having low heat resistance or a flexible substrate as well.

In this specification and the like, a transistor can be formed using a variety of substrates, for example. There is no particular limitation on the type of substrate. Examples of the substrate include a semiconductor substrate (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base film. Examples of a glass substrate include a barium borosilicate glass substrate, an aluminoborosilicate glass substrate, and a soda lime glass substrate. Examples of materials of a flexible substrate, an attachment film, a base film, and the like include plastic typified by polyethylene terephthalate (PET), polyethylene naphthalate (PEN), polyether sulfone (PES), and polytetrafluoroethylene (PTFE); a synthetic resin such as acrylic, polypropylene, polyester, polyvinyl fluoride, polyvinyl chloride, polyamide, polyimide, aramid, and epoxy; an inorganic vapor deposition film; and paper. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption of the circuit or higher integration of the circuit.

The separation layer can be a stack including inorganic films (e.g., a tungsten film and a silicon oxide film) or an organic resin film of polyimide or the like formed over a substrate, for example.

In other words, a transistor may be formed using one substrate and then transferred to another substrate. Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent characteristics, a transistor with low power consumption, or a device with high durability, high heat resistance, or reduced weight or thickness.

The insulating layer 212 can be an insulating layer including at least one of the following films formed by a plasma enhanced chemical vapor deposition (PECVD) method, a sputtering method, or the like: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating layer 213 can appropriately employ any of materials or structures that can be used for the insulating layer 212.

The conductive layer 214 can appropriately employ any of materials or structures that can be used for the conductive layers 201A to 201F.

Note that the transistor described in Embodiment 1 can have the structure described above. The transistor described in Embodiment 1 is preferably a transistor in which a channel formation region is included in an oxide semiconductor layer. Since the transistor in which a channel formation region is included in an oxide semiconductor layer exhibits a low off-state current, leakage of charge from the nodes 31 to 34 can be decreased; thus, changes in potential of the nodes 31 to 34 can be decreased.

This embodiment can be combined with any other embodiment as appropriate. Note that a content (or part thereof) described in one embodiment may be applied to, combined with, or replaced with a different content (or part thereof) described in the embodiment and/or a content (or part thereof) described in one or more different embodiments. Note that in each embodiment, a content described in the embodiment is a content described with reference to a variety of diagrams or a content described with text in this specification. In addition, by combining a diagram (or part thereof) described in one embodiment with another part of the diagram, a different diagram (or part thereof) described in the embodiment, and/or a diagram (or part thereof) described in another embodiment or other embodiments, much more diagrams can be created. The same can be applied to any other embodiment.

(Embodiment 3)

In this embodiment, a display module and electronic devices that include the semiconductor device or the display device of one embodiment of the present invention will be described with reference to FIG. 32 and FIGS. 33A to 33G.

Figure 32:
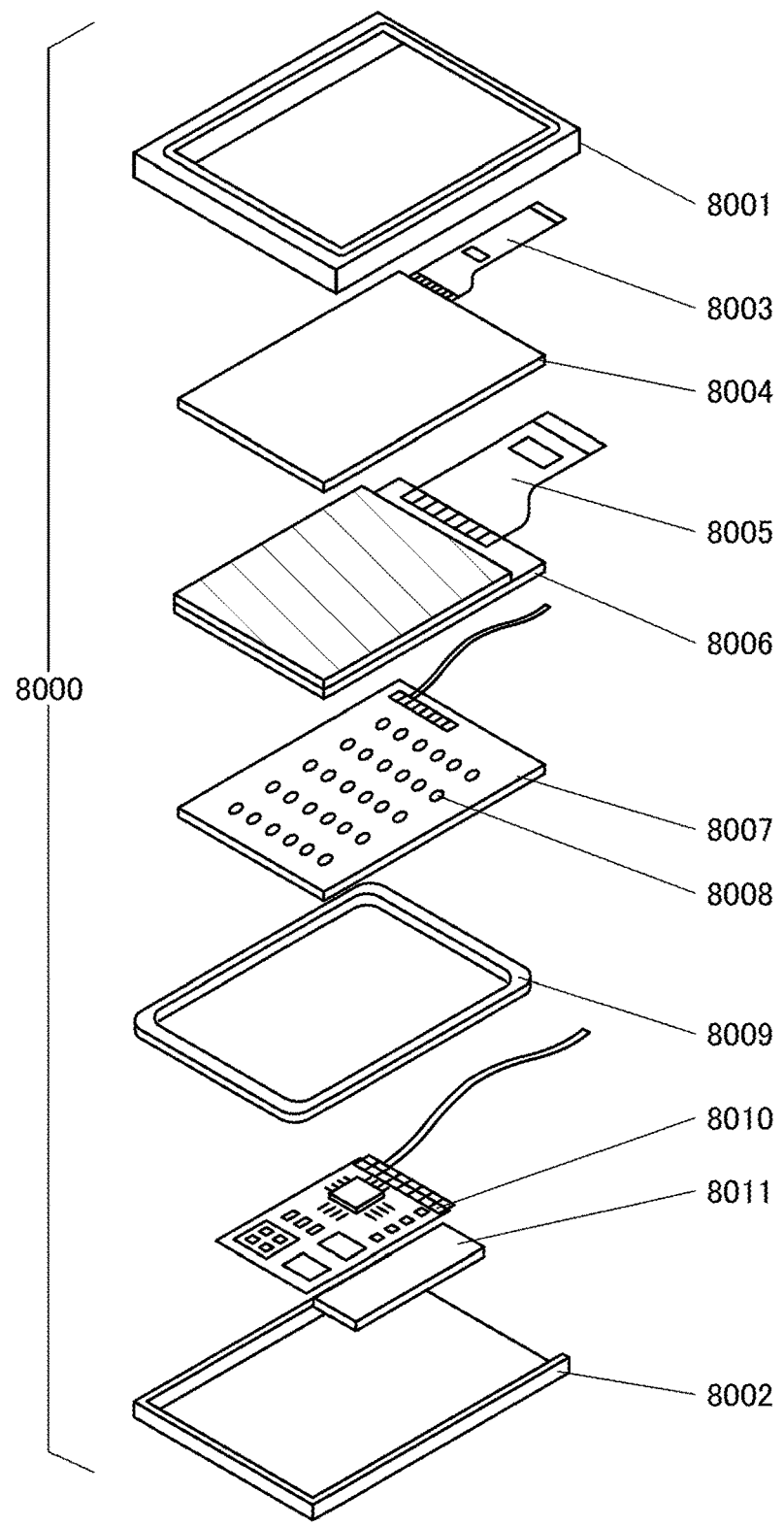
FIG. 32 illustrates an example of a display module.

In a display module 8000 illustrated in FIG. 32, a touch panel 8004 connected to an FPC 8003, a display panel 8006 connected to an FPC 8005, a backlight 8007, a frame 8009, a printed circuit board 8010, and a battery 8011 are provided between an upper cover 8001 and a lower cover 8002.

The semiconductor device or the display device of one embodiment of the present invention can be used for, for example, the display panel 8006.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can overlap the display panel 8006. It is also possible to provide a touch panel function for a counter substrate (sealing substrate) of the display panel 8006. A photosensor may be provided in each pixel of the display panel 8006 so that an optical touch panel is obtained.

The backlight 8007 includes a light source 8008. Although the light sources 8008 are provided over the backlight 8007 in FIG. 32, one embodiment of the present invention is not limited to this structure. For example, it is possible to employ a structure in which the light source 8008 is provided at an end portion of the backlight 8007 and a light diffusion plate is provided. Note that the backlight 8007 need not be provided in a reflective panel or the like or in the case of using a self-luminous light-emitting element such as an organic EL element.

The frame 8009 protects the display panel 8006 and functions as an electromagnetic shield for blocking electromagnetic waves generated by the operation of the printed circuit board 8010. The frame 8009 may also have a function of a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

FIGS. 33A to 33G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIGS. 33A to 33G can have a variety of functions, for example, a function of displaying a variety of data (e.g., a still image, a moving image, and a text image) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on the display portion. Note that functions that can be provided for the electronic devices shown in FIGS. 33A to 33G are not limited to the above, and the electronic devices can have a variety of functions.

Although not illustrated in FIGS. 33A to 33G, the electronic device may include a plurality of display portions. Furthermore, the electronic device may be provided with a camera and the like and have a function of shooting a still image, a function of shooting a moving image, a function of storing a shot image in a memory medium (an external memory medium or a memory medium incorporated in the camera), a function of displaying a shot image on the display portion, and the like.

The electronic devices illustrated in FIGS. 33A to 33G will be described in detail.

Figure 33A:
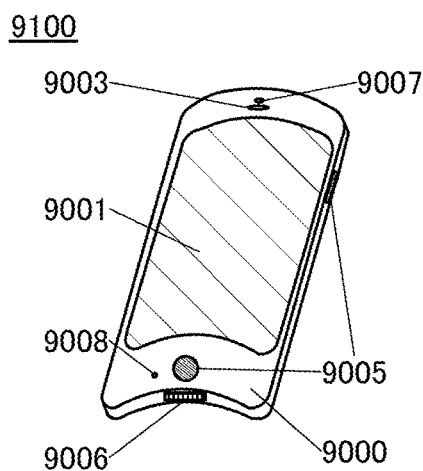
FIGS. 33A to 33G illustrate examples of electronic devices.

FIG. 33A is a perspective view illustrating a portable information appliance 9100. A display portion 9001 of the portable information appliance 9100 is flexible; therefore, the display portion 9001 can be incorporated along a bent surface of a bent housing 9000. The display portion 9001 includes a touch sensor, and operation can be performed by touching the screen with a finger, a stylus, or the like. For example, an application can be started by touching an icon displayed on the display portion 9001.

Figure 33D:
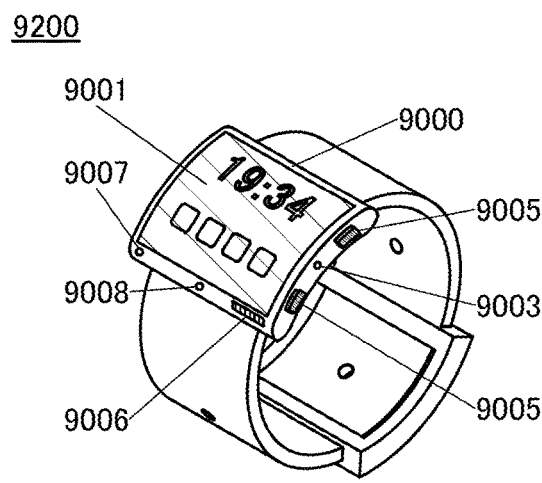
Figure 33B:
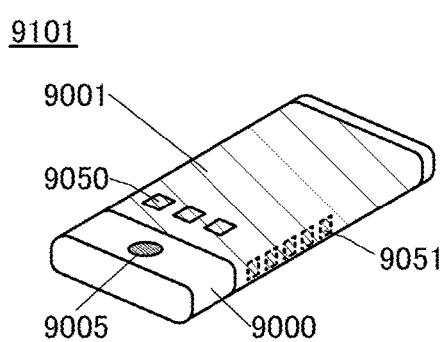

FIG. 33B is a perspective view of a portable information appliance 9101. The portable information appliance 9101 has a function of at least one of a telephone set, a notebook, and an information browsing system, for example. Specifically, the portable information appliance 9101 can be used as a smartphone. Note that the speaker 9003, the connection terminal 9006, the sensor 9007, and the like of the portable information appliance 9101, which are not illustrated in FIG. 33B, can be provided as in the portable information appliance 9100 of FIG. 33A. The portable information appliance 9101 can display letters and image data on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and an SNS massage; the date; the time; remaining battery; and the reception strength of an antenna. Alternatively, the operation buttons 9050 or the like may be displayed in place of the information 9051.

Figure 33E:
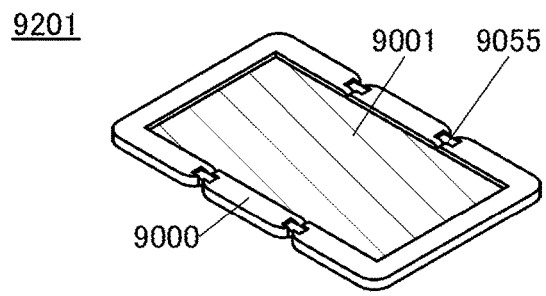
Figure 33C:
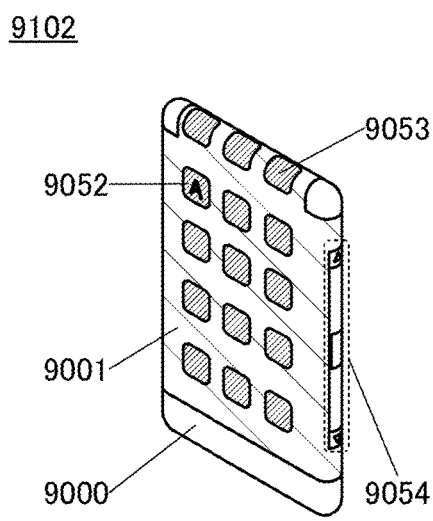

FIG. 33C is a perspective view illustrating a portable information appliance 9102. The portable information appliance 9102 has a function of displaying information on three or more surfaces of the display portion 9001. Here, information 9052, information 9053, and information 9054 are displayed on different surfaces. For example, a user of the portable information appliance 9102 can see the display (here, the information 9053) with the portable information appliance 9102 put in a breast pocket. Specifically, a caller's phone number, name, or the like of an incoming call is displayed in a position that can be seen from above the portable information appliance 9102. Thus, the user can see the display without taking out the portable information appliance 9102 from the pocket and decide whether to answer the call.

FIG. 33D is a perspective view illustrating a wrist-watch-type portable information appliance 9200. The portable information appliance 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information appliance 9200 can employ near field communication based on a communication standard. For example, hands-free calling is possible with mutual communication between the portable information appliance 9200 and a headset capable of wireless communication. Moreover, the portable information appliance 9200 includes the connection terminal 9006, and data can be directly transmitted to and received from another information appliance via a connector. The portable information appliance 9200 can be charged through the connection terminal 9006. Note that the charging operation may be performed by wireless power feeding without using the connection terminal 9006.

Figure 33F:
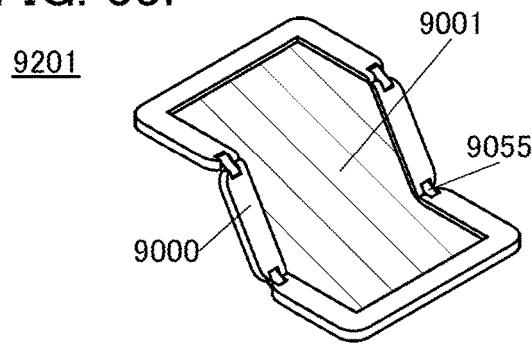
Figure 33G:
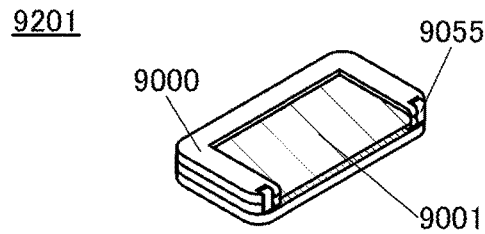

FIGS. 33E, 33F, and 33G are perspective views illustrating a foldable portable information appliance 9201 that is opened, that is being opened or being folded, and that is folded. The portable information appliance 9201 is highly portable when folded. When the portable information appliance 9201 is opened, a seamless large display region is highly browsable. The display portion 9001 of the portable information appliance 9201 is supported by three housings 9000 joined by hinges 9055. By folding the portable information appliance 9201 at a connection portion between two housings 9000 with the hinges 9055, the portable information appliance 9201 can be reversibly changed in shape from an opened state to a folded state. For example, the portable information appliance 9201 can be bent with a radius of curvature of 1 mm to 150 mm.

The semiconductor device or the display device of one embodiment of the present invention can be used for the display portion 9001.

The electronic device described in this embodiment includes a display portion for displaying some sort of information. Note that the semiconductor device of one embodiment of the present invention can also be used for an electronic device that does not have a display portion. In addition, this embodiment shows the example where the display portion of the electronic device is flexible and can display images on the bent display surface, and the example where the display portion is foldable. However, one embodiment of the present invention is not limited to these examples, and it is possible to employ a structure where the display portion is not flexible and images are displayed on a flat surface.

This application is based on Japanese Patent Application serial No. 2014-215922 filed with Japan Patent Office on Oct. 23, 2014, the entire contents of which are hereby incorporated by reference.

What is claimed is:

1. A semiconductor device comprising:
a first transistor, a second transistor, a third transistor, a fourth transistor, a fifth transistor, a sixth transistor, and a MEMS device,
wherein:
one of a source and a drain of the first transistor is electrically connected to one of a source and a drain of the second transistor,
one of a source and a drain of the third transistor is electrically connected to a gate of the first transistor,
one of a source and a drain of the fourth transistor is electrically connected to one of a source and a drain of the fifth transistor,
one of a source and a drain of the sixth transistor is electrically connected to a gate of the fourth transistor,
a gate of the fifth transistor is electrically connected to the gate of the first transistor, the one of the source and the drain of the first transistor is electrically connected to a first electrode of the MEMS device, and
the one of the source and the drain of the fourth transistor is electrically connected to a second electrode of the MEMS device.

2. The semiconductor device according to claim 1, wherein a channel formation region of at least one of the first to sixth transistors comprises an oxide semiconductor.

3. The semiconductor device according to claim 1, further comprising a first capacitor and a second capacitor,
wherein:
a first electrode of the first capacitor is electrically connected to the one of the source and the drain of the first transistor,
a second electrode of the first capacitor is electrically connected to the gate of the first transistor,
a first electrode of the second capacitor is electrically connected to the one of the source and the drain of the fourth transistor, and
a second electrode of the second capacitor is electrically connected to the gate of the fourth transistor.

4. The semiconductor device according to claim 1,
wherein a W/L ratio of the first transistor is higher than a W/L ratio of the second transistor, where W is a channel width and L is a channel length, and
wherein a W/L ratio of the fourth transistor is higher than a W/L ratio of the fifth transistor.

5. A display module comprising:
the semiconductor device according to claim 1; and
an FPC.

6. An electronic device comprising:
the display module according to claim 5; and
at least one of an antenna, an operation button, and a speaker.

7. A semiconductor device comprising:
a first transistor, a second transistor, a third transistor, a fourth transistor, a fifth transistor, a sixth transistor, and a MEMS device,
wherein:
one of a source and a drain of the first transistor is electrically connected to one of a source and a drain of the second transistor,
one of a source and a drain of the third transistor is electrically connected to a gate of the first transistor,
one of a source and a drain of the fourth transistor is electrically connected to one of a source and a drain of the fifth transistor,
one of a source and a drain of the sixth transistor is electrically connected to a gate of the fourth transistor,
a gate of the second transistor is electrically connected to the gate of the fourth transistor,
a gate of the fifth transistor is electrically connected to the gate of the first transistor,
the one of the source and the drain of the first transistor is electrically connected to a first electrode of the MEMS device, and
the one of the source and the drain of the fourth transistor is electrically connected to a second electrode of the MEMS device.

8. The semiconductor device according to claim 7, wherein a channel formation region of at least one of the first to sixth transistors comprises an oxide semiconductor.

9. The semiconductor device according to claim 7, further comprising a first capacitor and a second capacitor,
wherein:
- a first electrode of the first capacitor is electrically connected to the one of the source and the drain of the first transistor,
- a second electrode of the first capacitor is electrically connected to the gate of the first transistor,
- a first electrode of the second capacitor is electrically connected to the one of the source and the drain of the fourth transistor, and
- a second electrode of the second capacitor is electrically connected to the gate of the fourth transistor.

10. The semiconductor device according to claim 7,
wherein a W/L ratio of the first transistor is higher than a W/L ratio of the second transistor, where W is a channel width and L is a channel length, and
wherein a W/L ratio of the fourth transistor is higher than a W/L ratio of the fifth transistor.

11. A display module comprising:
the semiconductor device according to claim 7; and
an FPC.

12. An electronic device comprising:
the display module according to claim 11; and
at least one of an antenna, an operation button, and a speaker.

* * * * *